(12) United States Patent
Achtenberg et al.

(10) Patent No.: US 10,564,900 B2
(45) Date of Patent: Feb. 18, 2020

(54) TEMPERATURE VARIATION COMPENSATION

(71) Applicant: Western Digital Technologies, Inc., San Jose, CA (US)

(72) Inventors: Stella Achtenberg, Netanya (IL); Eran Sharon, Rishon Lezion (IL); David Rozman, Kiryat-Malakhi (IL); Alon Eyal, Zichron Yaakov (IL); Idan Alrod, Herzliya (IL); Dana Lee, Saratoga, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/004,806

(22) Filed: Jun. 11, 2018

(65) Prior Publication Data
US 2018/0293029 A1 Oct. 11, 2018

Related U.S. Application Data

(63) Continuation-in-part of application No. 15/167,316, filed on May 27, 2016, now Pat. No. 9,996,281, and
(Continued)

(51) Int. Cl.
*G11C 7/00* (2006.01)
*G06F 3/06* (2006.01)
(Continued)

(52) U.S. Cl.
CPC ............ *G06F 3/0679* (2013.01); *G06F 3/064* (2013.01); *G06F 3/0619* (2013.01);
(Continued)

(58) Field of Classification Search
CPC ..... G06F 3/0679; G06F 11/1048; G11C 7/04; G11C 16/3418; G11C 29/028; G11C 11/5642; G11C 16/26
See application file for complete search history.

(56) References Cited

U.S. PATENT DOCUMENTS 7,205,758 B1 * 4/2007 Masleid ............. H03K 19/0027
  324/750.3
7,782,674 B2 8/2010 Roohparvar et al.
(Continued)

OTHER PUBLICATIONS

International Search Report issued in International Patent Application No. PCT/US2017/019612, dated Jul. 14, 2017 (14 pages).
(Continued)

*Primary Examiner* — Uyen B Tran
(74) *Attorney, Agent, or Firm* — Patterson & Sheridan, LLP; Steven H. Versteeg

(57) ABSTRACT

A data storage device includes a non-volatile memory and a controller coupled to the non-volatile memory. The controller is operable to measure a first threshold voltage (Vt) of a memory cell under a first parameter at a read temperature and measure a second Vt of the memory cell under a second parameter at the read temperature in which the first parameter is different from the second parameter. A Vt correction term for the memory cell is determined based upon the first Vt measurement and the second Vt measurement. A read Vt of the memory cell is adjusted by using the Vt correction term.

20 Claims, 19 Drawing Sheets

Related U.S. Application Data a continuation-in-part of application No. 15/619,157, filed on Jun. 9, 2017, now Pat. No. 10,446,242, which is a continuation-in-part of application No. 15/167,316, filed on May 27, 2016, now Pat. No. 9,996,281.

(60) Provisional application No. 62/518,548, filed on Jun. 12, 2017, provisional application No. 62/303,891, filed on Mar. 4, 2016.

(51) Int. Cl.

| | | |
|---|---|---|
| *G11C 16/26* | (2006.01) | |
| *G11C 11/56* | (2006.01) | |
| *G06F 11/10* | (2006.01) | |
| *G11C 16/10* | (2006.01) | |
| *G11C 7/04* | (2006.01) | |
| *G11C 16/34* | (2006.01) | |
| *G11C 29/02* | (2006.01) | |
| *G11C 29/52* | (2006.01) | |
| *G11C 29/04* | (2006.01) | |

(52) U.S. Cl.
CPC ...... *G06F 11/1048* (2013.01); *G06F 11/1068* (2013.01); *G11C 7/04* (2013.01); *G11C 11/5628* (2013.01); *G11C 11/5642* (2013.01); *G11C 16/10* (2013.01); *G11C 16/26* (2013.01); *G11C 16/3418* (2013.01); *G11C 29/021* (2013.01); *G11C 29/028* (2013.01); *G11C 29/52* (2013.01); *G11C 2029/0409* (2013.01)

(56) References Cited

U.S. PATENT DOCUMENTS

| | | |
|---|---|---|
| 7,881,120 B2 | 2/2011 | Yoshihara et al. |
| 8,296,625 B2 | 10/2012 | Diggs et al. |
| 8,472,274 B2 | 6/2013 | Fai et al. |
| 8,687,421 B2 | 4/2014 | Avila et al. |
| 9,202,579 B2 | 12/2015 | Hsiung et al. |
| 2006/0104140 A1 | 5/2006 | Tahara |
| 2010/0157672 A1* | 6/2010 | Barkley .................. G11C 7/04 365/185.03 |
| 2011/0121795 A1* | 5/2011 | Vulih ................. H02M 3/1584 323/234 |
| 2011/0145521 A1 | 6/2011 | Aoki et al. |
| 2011/0302353 A1 | 12/2011 | Confalonieri et al. |
| 2012/0134213 A1 | 5/2012 | Choi et al. |
| 2012/0144270 A1 | 6/2012 | Diggs et al. |
| 2012/0224425 A1 | 9/2012 | Fai et al. |
| 2013/0290600 A1 | 10/2013 | Tzafrir |
| 2014/0035560 A1 | 2/2014 | Olmos et al. |
| 2014/0226412 A1 | 8/2014 | Yeh et al. |
| 2015/0235706 A1 | 8/2015 | Chu |
| 2015/0310938 A1 | 10/2015 | Kim et al. |
| 2016/0117216 A1 | 4/2016 | Muchherla et al. |
| 2017/0117033 A1 | 4/2017 | Doo et al. |

OTHER PUBLICATIONS

International Preliminary Report on Patentability and Written Opinion issued in corresponding International Patent Application No. PCT/US2017/019612, dated Sep. 4, 2018 (11 pages).

\* cited by examiner

300

Default Value of a Read Voltage 301

302 Offset Table

|  |  | Read Temperature Range | | | | |
|---|---|---|---|---|---|---|
|  |  | 0 | 1 | 2 | 3 | 4 |
| Write Temperature Range | 0 | N/A | Offset_Neg_1 | Offset_Neg_2 | Offset_Neg_3 | Offset_Neg_4 |
|  | 1 | Offset_Pos_1 | N/A | Offset_Neg_1 | Offset_Neg_2 | Offset_Neg_3 |
|  | 2 | Offset_Pos_2 | Offset_Pos_1 | N/A | Offset_Neg_1 | Offset_Neg_2 |
|  | 3 | Offset_Pos_3 | Offset_Pos_2 | Offset_Pos_1 | N/A | Offset_Neg_1 |
|  | 4 | Offset_Pos_4 | Offset_Pos_3 | Offset_Pos_2 | Offset_Pos_1 | N/A |

304 Range Table

| Range | Temperature |
|---|---|
| 0 | -25 to 0 |
| 1 | 1 to 25 |
| 2 | 26 to 50 |
| 3 | 51 to 75 |
| 4 | 76 to 100 |

*FIG. 3*

TEMPERATURE VARIATION COMPENSATION

CROSS-REFERENCE TO RELATED APPLICATIONS

The present application claims priority to U.S. Provisional Patent Application Ser. No. 62/518,548, filed Jun. 12, 2017. The present application is also a continuation-in-part of and claims priority to U.S. patent application Ser. No. 15/167,316, filed May 27, 2016, which application claims priority and benefit of U.S. Provisional Patent Application Ser. No. 62/303,891, filed Mar. 4, 2016. The present application is also a continuation-in-part of and claims priority to U.S. patent application Ser. No. 15/619,157 filed Jun. 9, 2017, which application is a continuation-in-part of and claims priority to U.S. patent application Ser. No. 15/167,316, filed May 27, 2016, which application claims priority and benefit of U.S. Provisional Patent Application Ser. No. 62/303,891, filed Mar. 4, 2016. Each of the forgoing applications are herein incorporated by reference in their entirety.

BACKGROUND OF THE DISCLOSURE

Field of the Disclosure

This disclosure is generally related to data storage devices and more particularly to improved data storage devices compensating for temperature variations.

Description of the Related Art

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate (BER) of data stored at the memory device may also increase.

In addition, increased BER due to temperature changes between programming temperature (e.g., a temperature of a memory when data is written to the memory) and later reading temperature (e.g., a temperature of the memory when the data is read from the memory) is becoming an increasingly significant issue in recent memory generations. Because each storage element of a non-volatile data storage device may have a distinct cross temperature coefficient (TCO), each storage element may exhibit a different threshold voltage (Vt) shift due to a temperature change relative to the temperature at which the storage element was programmed and verified. The Vt shift per storage element is a function of the temperature difference. As a result, reading a page at a different temperature than the programming temperature of the page results in shifting and widening of the cell voltage distributions (CVDs) of the different states of the storage devices and in an increased BER. Shifting and widening of the CVDs and increased BER arises in both temperature change directions, such as when data is read from storage elements at a higher temperature than the data was written to the storage elements, and also when the data is read from storage elements at a lower temperature than the data was written to the storage elements.

SUMMARY OF THE DISCLOSURE

In one embodiment, a data storage device includes a non-volatile memory and a controller coupled to the non-volatile memory. The controller is operable to measure a first Vt of a memory cell under a first parameter at a read temperature and measure a second Vt of the memory cell under a second parameter at the read temperature in which the first parameter is different from the second parameter. A Vt correction term for the memory cell is determined based upon the first Vt measurement and the second Vt measurement. A read Vt of the memory cell is adjusted by using the Vt correction term.

In another embodiment, a method of accessing data from a data storage device includes measuring a first plurality of threshold voltages (Vts) of a page of memory cells under a first parameter at a read temperature. The first parameter includes a first bit line voltage and a first sense amplifier integration time. A second plurality of Vts of the page of memory cell under a second parameter at the read temperature is measured. The second parameter includes a second bit line voltage and a second sense amplifier integration time. A Vts correction term is estimated for each memory cell of the page of memory cells based upon the measured Vts under the first parameter and the measured Vts under the second parameter. A read Vt for each memory cell of the page of memory cells is adjusted by using the Vt correction term.

In yet another embodiment, a non-transitory computer readable storage medium containing instructions that, when executed by a controller, perform a method of accessing data from a data storage device. The method includes measuring a first Vt and a second Vt of a memory cell at different read parameters. A TCO proxy for the memory cell is determined. An estimated TCO value correlated to the TCO proxy of the memory cell is retrieved. A read Vt of the memory cell is adjusted by using the estimated TCO value.

In still another embodiment, a data storage device includes a non-volatile memory and a cell voltage distribution mitigating means for adjusting a Vt of a memory cell of the non-volatile memory. The cell voltage distribution mitigation means operable to measure the Vt of the memory cell at two different read parameters at a read temperature.

In still another embodiment, a method of mitigating cell voltage distribution widening due to cross temperature conditions in a data storage device. The method includes characterizing an estimated TCO value for each memory cell of one or more memory arrays, where the characterization generates an offline look-up table, and where the look-up table correlates a single proxy to a single TCO value, measuring a Vt at a read temperature with one or more read parameters to determine one or more proxy vectors, applying the proxy vector to determine a corrected Vt, and applying the corrected Vt to a read/write operation.

BRIEF DESCRIPTION OF THE DRAWINGS

FIG. 3 is a diagram illustrating a particular example of tables that may be used by the data storage device of FIG. 1A, according to one embodiment.

DETAILED DESCRIPTION

Figure 1A:
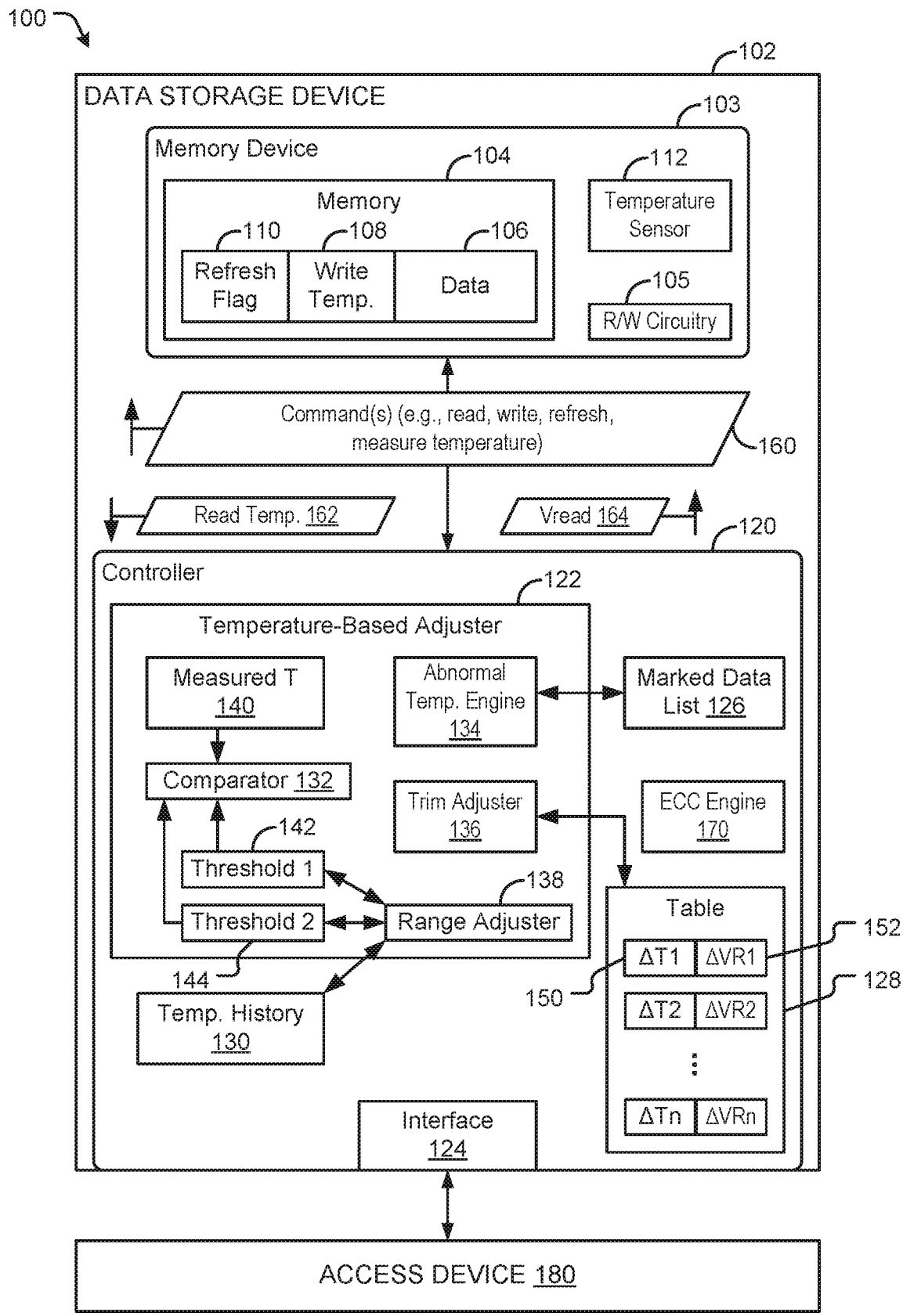
FIG. 1A is a block diagram of an illustrative example of a system including a data storage device configured to adjust memory access parameters based on temperature, according to one embodiment.

Devices and methods provide compensation for shifting and widening of Vt levels due to differences of programming temperatures as compared to reading temperature variations. For example, a "write temperature" may be measured and stored during programming of data. To illustrate, a write temperature may be stored once for each programmed block (e.g., an erase block of an NAND flash memory) or once for each programmed word line (WL), as non-limiting examples. In some implementations, if the programming temperature is in an "abnormal" range, a compensation scheme may be performed.

In some implementations, during reading data, a "read temperature" for each read block or WL may be measured. One or more memory access parameters, such as read Vts, may be adjusted based on tracking the CVD, based on BER, based on tables that are based on the difference between the write temperature and the read temperature, or any combination thereof, as illustrative, non-limiting examples.

In some implementations, when an "abnormal" programming temperature is detected, one of more compensation schemes may be performed. For example, the "abnormal" programmed data may be marked for "urgent" refresh. To illustrate, marking the data for "urgent" refresh may cause a data storage device to refresh the marked data as a high priority task in response to detecting that the memory temperature has returned to the "normal" temperature range. As another example, the "abnormal" programmed data may be stored using a slower and more reliable trim (e.g., a set of write parameters that cause data to be written with increased accuracy). As other examples, the "abnormal" programmed data may be stored using a SLC mode instead of using an MLC mode, may be stored as multiple redundant copies, may be protected using a greater number of parity bits, or any combination thereof.

In some implementations, non-volatile memory (NVM) cell Vt shifting may be compensated by adjusting read thresholds. Adjusting read thresholds may be performed based on the difference between the temperature measured during reading compared to the temperature logged during writing or programming (which may be measured and stored per block or per word line (WL)). The read thresholds adjustment value may also be a function of the logged programming temperature (and not only of the temperature difference), in case the shifting is different when programming at low temperature vs. high temperature. The read thresholds adjustment may be performed using a predefined table as a function of the temperature difference and optionally as a function of the programming temperature. Alternatively, read thresholds adjustment may be performed by running a read thresholds calibration algorithm, such as CVD tracking or BER Estimation Scan (BES), on representative page(s) from the block(s) that were programmed at the same temperature.

If "extreme" temperature differences are rare events, then the foreground CVD tracking or the BES method may provide accurate results with relatively low complexity because logging and managing the programming temperature per WL or per block may be omitted. If such extreme temperature differences are expected to occur more frequently, accurate results with enhanced performance may be provided by measuring and storing write temperatures and adjusting for temperature differences as compared to performing foreground CVD tracking or BES operations. Alternatively, groups of blocks or WLs that were programmed at approximately the same time and temperature may be associated with a certain time & temperature tag for which an appropriate set of read or memory access parameters may be maintained. The read or memory access parameters of the group associated with a given time & temperature tag may be adjusted from time to time by running a read thresholds calibration algorithm, such as CVD tracking or BES, on representative page(s) from the group. This may be performed as a background maintenance process or triggered when suboptimal read or memory access parameters are encountered (e.g. high BER encountered during a host read).

The above operations (e.g., CVD tracking, BES operations, storing write temperatures, and adjusting read voltages based on a change in temperature) may be used to compensate for the Vt shifting due to programming vs. reading temperature differences. However, use of such operations may still result in increased BER due to Vt distribution widening. Vt distribution widening may be compensated as disclosed in the following example.

In an example implementation of Vt distribution widening compensation, the maximal temperature difference that the memory allows is 80 degrees Celsius (80° C.). Because the maximum allowed temperature difference is 80° C., successful reading of any data experiencing a write/read temperature difference greater than 80° C. is not guaranteed, even after read thresholds adjustment/shifting. In this case, a "normal" operating temperature range may be defined as the temperature range spanning from 5° C. to 65° C. Anything programmed outside of this normal temperature range receives "special treatment," such as one or more of the operations described above (e.g., marked for urgent refresh, stored using a slower and more reliable trim, stored using a SLC mode instead of using an MLC mode, stored as multiple redundant copies, protected using a greater number of parity bits). Because programming data outside the "normal" temperature range may be expected to be a rare event, the "special treatment" may be implemented for a small fraction of the traffic and therefore has minor overall impact on device performance.

If data is programmed at a temperature that is outside of the "normal" temperature range, the data is protected more carefully by one of the options above (or refreshed urgently once the temperature gets back in the normal range). On the other hand, if the data is programmed at a temperature that is inside of the "normal" temperature range, even if the data is read at an extreme temperature outside the normal range (e.g., at −25° C. or at 85° C.), the maximal temperature difference between writing the data and reading the data does not exceed the allowed 80° C. difference.

Additional temperature ranges may be implemented. For example, there may be a "normal" temperature range and several "abnormal" temperature ranges, from a slightly out-of-range temperature to an extreme out-of-range temperature. The countermeasures ("special treatment") taken when programming outside of the "normal" temperature range may be adjusted based on the specific temperature range (i.e. based on how different it is from the "normal" temperature range). For example, a nominal programming trim ("trim0") may be used for programming when in the "normal" temperature range. A slower and finer trim ("trim1") may be used for programming when in a slightly "abnormal" temperature range. An even slower and finer trim ("trim2") may be used for programming when in an extreme "abnormal" temperature range.

The temperature ranges (both "normal" and "abnormal") may be predefined. Alternatively, they may be adjusted dynamically, either per region of the memory or adaptively by a controller of the memory. For example, the controller may track the temperature range at which most of the traffic is being programmed and define this range as the "normal" temperature range.

Optionally, a hybrid partition may be used to store one or more additional copies of data stored at an "extreme" temperature instead of moving the data if the amount of data written at the "extreme" temperature is relatively small. A decoder that includes an error correction coding (ECC) engine may be used to decode the two or more copies and retrieve the data. The LLR inputs for the decoder may be based on the two copies, such as be summing the LLRs of the two copies. This is equivalent to assigning high reliability to bits for which the two copies agree and low reliability (or zero reliability, if both copies have same reliability) whenever the two copies disagree.

In some implementations, in order to prevent wide programming temperature variations within a block, partially-written open blocks may be closed in response to a change in programming temperature changes above a predetermined value. Closing the blocks avoids a mixture of data programmed in various temperatures that may be problematic, and especially in an abnormal temperature region, such as described in further detail with reference to FIGS. 4-5. Boundary word lines/string lines may be "padded" by writing dummy data isolating the boundary WLs and thus protecting the boundary WLs from temperature cross effect, as described with reference to FIG. 4. Optionally, affected boundary string lines/WLs may be evacuated immediately or within a short time after a decision is made to prematurely close a block with high priority.

In some implementations, rather than storing memory access parameters (e.g., read voltages) corresponding to specific temperatures or temperature ranges, offset values may instead be used. For example, when programming data at a given temperature, there is a set of read parameters that is "optimum" for reading the data at the given temperature. This temperature can be recorded at the system level, and the "optimum" read condition can also be calculated or determined (e.g., by means of CVD tracking or BES). When the data is read, the read temperature can be measured. If the temperature difference between the write temperature and the read temperature is larger than a threshold, then a read offset may be applied to the original read condition (e.g., as an adjustment from the "optimum" read parameter) so that the resulting read parameters enable a more accurate read of the data based on the temperature difference. If the temperature difference is relatively small, then the data may be accessed with the original reading condition without any offset compensation.

After generating adjusted read parameters based on the temperature difference and reading the data, a BER for the data may be determined. If the BER is above a threshold (e.g., exceeds an error correction capacity of the ECC scheme that encodes the data), then the original read condition may be inadequate, or the offset may be inadequate. In this case, read parameters may be calibrated via CVD tracking or BES and data may be read again with the calibrated parameters with a reduced number of errors.

In some implementations, temperature compensation may not be applied other than during "heroics" when a BER of data read from the memory renders the data undecodable. In such cases, application of offset values to read parameters based on the temperature difference may enable the data to be read with reduced BER. In some implementations, temperature compensation may be applied in response to detecting a pattern of relatively-high BER during a sequence of read operations. For example, in response to a sequence of reads from the memory resulting in high (but still correctable) BER, a memory controller may read a write temperature associated with the data and may apply a read voltage offset based on the temperature difference for remaining read operations of the sequence, as described in further detail with reference to FIG. 7.

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identificatoin and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

FIG. 1A depicts an illustrative example of a system 100 that includes a data storage device 102 and an access device 180 (e.g., a host device or another device). The data storage device 102 includes a temperature-based adjuster 122 that is configured to perform compensation based on temperature differences between writing data to a memory 104 and reading the data from the memory 104. The temperature-based adjuster 122 is also configured to perform compensation based on a programming temperature (e.g., a temperature of the memory 104 that is measured just before, during, or after data is written into the memory 104) being outside of a "normal" temperature range.

The data storage device 102 and the access device 180 may be coupled via a connection (e.g., a communication path), such as a bus or a wireless connection. The data storage device 102 may include a first interface 124 (e.g., an access device or host interface) that enables communication via the communication path between the data storage device 102 and the access device 180.

The data storage device 102 may include or correspond to a SSD which may be included in, or distinct from (and accessible to), the access device 180. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 180 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a SSD device) of a data center storage system, an enterprise storage system, or a storage area network.

In some implementations, the data storage device 102 may be embedded within the access device 180, such as in accordance with a Joint Electron Devices Engineering Council (JEDEC) Solid State Technology Association Universal Flash Storage (UFS) configuration. For example, the data storage device 102 may be configured to be coupled to the access device 180 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 180 (i.e., "removably" coupled to the access device 180). As an example, the data storage device 102 may be removably coupled to the access device 180 in accordance with a removable universal serial bus (USB) configuration.

The data storage device 102 may operate in compliance with an industry specification. For example, the data storage device 102 may include a SSD and may be configured to communicate with the access device 180 using a small computer system interface (SCSI)-type protocol, such as a serial attached SCSI (SAS) protocol. As other examples, the data storage device 102 may be configured to communicate with the access device 180 using a NVM Express (NVMe) protocol or a serial advanced technology attachment (SATA) protocol. In other examples, the data storage device 102 may operate in compliance with a JEDEC eMMC specification, a JEDEC Universal Flash Storage (UFS) specification, one or more other specifications, or a combination thereof, and may be configured to communicate using one or more protocols, such as an eMMC protocol, a universal flash storage (UFS) protocol, a USB protocol, and/or another protocol, as illustrative, non-limiting examples.

The access device 180 may include a memory interface (not shown) and may be configured to communicate with the data storage device 102 via the memory interface to read data from and write data to a memory device 103 of the data storage device 102. For example, the access device 180 may be configured to communicate with the data storage device 102 using a SAS, SATA, or NVMe protocol. As other examples, the access device 180 may operate in compliance with a Joint Electron Devices Engineering Council (JEDEC) industry specification, such as a Universal Flash Storage (UFS) Access Controller Interface specification. The access device 180 may communicate with the memory device 103 in accordance with any other suitable communication protocol.

The access device 180 may include a processor and a memory. The memory may be configured to store data and/or instructions that may be executable by the processor. The memory may be a single memory or may include multiple memories, such as one or more non-volatile memories, one or more volatile memories, or a combination thereof. The access device 180 may issue one or more commands to the data storage device 102, such as one or more requests to erase data, read data from, or write data to the memory device 103 of the data storage device 102. For example, the access device 180 may be configured to provide data, such as data 182, to be stored at the memory device 103 or to request data to be read from the memory device 103. The access device 180 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes the memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate, such as a BiCS memory array. Alternatively, the memory 104 may have another configuration, such as a two-dimensional (2D) memory configuration or a non-monolithic 3D memory configuration (e.g., a stacked die 3D memory configuration).

Continuing with FIG. 1A, although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, with each memory device including one or more packages of memory dies, each package of memory dies including one or more memories such as the memory 104. Data striping and error recovery as described with respect to pages of the memory 104 may be extended to include data striping and error recovery across multiple dies, across multiple packages, across multiple memory devices, or any combination thereof.

The memory 104 may include one or more blocks, such as a NAND flash erase group of storage elements. Each storage element of the memory 104 may be programmable to a state (e.g., a Vt in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry 105 that is operable to read data from and/or write data to storage elements within the individual memory die independent of any other read and/or write operations at any of the other memory dies.

The controller 120 is coupled to the memory device 103 via a bus, an interface (e.g., interface circuitry), another structure, or a combination thereof. For example, the bus may include one or more channels to enable the controller 120 to communicate with a single memory die of the memory device 103. As another example, the bus may include multiple distinct channels to enable the controller 120 to communicate with each memory die of the memory device 103 in parallel with, and independently of, communication with other memory dies of the memory device 103.

The controller 120 is configured to receive data and instructions from the access device 180 and to send data to the access device 180. For example, the controller 120 may send data to the access device 180 via the first interface 124, and the controller 120 may receive data from the access device 180 via the first interface 124. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 may also be configured to send data and commands to the memory 104 associated with background scanning operations, garbage collection operations, and/or wear leveling operations, etc., as illustrative, non-limiting examples. The controller 120 is configured to send a read command to the memory 104 to access data from a specified address of the memory 104. The read command may specify the physical address of a portion of the memory 104 (e.g., a physical address of a word line of the memory 104).

The memory device 103 may also include a temperature sensor 112. For example, the temperature sensor 112 may be configured to measure a temperature and to provide an indication of the measured temperature to the controller 120, such as a read temperature 162. For example, the temperature sensor 112 may be responsive to one or more commands 160, such as a command to measure temperature. The memory device 103 may include a single temperature sensor 112, or may include multiple temperatures sensors. For example, in an implementation with a memory device 103 that includes multiple memory dies, each of the multiple memory dies may include a separate temperature sensor 112 such as described with reference to FIG. 8. Each of the temperature sensors 112 may be independently polled by the controller 120 to provide a respective temperature 162 for the associated memory die.

The memory 104 is illustrated as including representative data 106. For example, the data 106 may include encoded data, such as an ECC codeword, that is written to one or more word lines in one or more blocks of the memory 104. The memory 104 may also store a write temperature 108 associated with the data 106. For example, the write temperature 108 may indicate a temperature measurement corresponding to the memory device 103 at a time the data 106 was written to the memory 104. For example, the write temperature 108 may be determined currently with, prior to, or following programming of the data 106 to the memory 104. The write temperature 108 may be stored in a block or word line as metadata in the block header or the word line header.

The memory 104 also includes a refresh flag 110 associated with the data 106. As discussed in further detail below, the refresh flag 110 may indicate that the data 106 was stored when the write temperature 108 at the memory 104 was in an abnormal temperature range. The refresh flag 110 may be accessed by the controller 120 to identify the data 106 as a target for refresh when the temperature of the memory 104 falls below a particular threshold temperature.

The controller 120 includes the temperature-based adjuster 122, a marked data list 126, an ECC engine 170, a temperature history 130, and a data structure (e.g., a table 128) that associates temperature differences to read voltage 164 parameters. The ECC engine 170 is configured to receive data to be stored to the memory 104 and to generate a codeword. For example, the ECC engine 170 may include an encoder configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 170 may include one or more decoders configured to decode data read from the memory 104 to detect and correct, up to an error correction capability of the ECC scheme, any bit errors that may be present in the data.

The temperature-based adjuster 122 is configured to perform one or more operations to adjust for differences between write temperatures and read temperatures of data written into and/or read from the memory 104. For example, the temperature-based adjuster 122 includes a comparator 132 configured to compare a measured temperature 140 to one or more thresholds, illustrated as a first threshold 142 and a second threshold 144. For example, an abnormal temperature engine 134 may be activated when the measured temperature 140 corresponds to a temperature at the time of writing data to the memory 104, such as a temperature retrieved from the temperature sensor 122 in response to receiving the data 106 at the controller 120 to be written to the memory device 103, in response to the comparator 132 determining that the measured temperature 140 exceeds the first threshold 132.

The abnormal temperature engine 134 may be configured to perform one or more operations associated with writing data to the memory 104 when a temperature of the memory 104 is in an abnormal range. For example, the abnormal temperature engine 134 may be responsive to the comparator 132 to add the refresh flag 110 to be stored at the memory 104 in conjunction with the data 106, to store an indication of the data 106 to the marked data list 126, to initiate one or more other actions, or any combination thereof. For example, the one or more other actions that may be initiated by the abnormal temperature engine 134 may correspond to designating that the data to be stored needs to be encoded using a higher number of parity bits at the ECC engine 170 than data that is stored when the temperature is not in the abnormal temperature range. Alternatively, or in addition, the abnormal temperature engine 134 may cause data to be stored in the memory 104 in a single level cell (SLC) mode instead of a multilevel cell (MLC) mode, with multiple copies of the data rather than a single copy, and/or with a slower and more reliable trim, e.g. an increased number of program pulses, a reduced programming voltage step size, or one or more other adjustments to cause programming to be more reliable than during normal operation.

A trim adjuster 136 may be configured to adjust one or more parameters used during writing data to or reading data from the memory 104. For example, the trim adjuster 136 may be configured to retrieve one or more offset values from the table 128 based on the difference between a temperature that the data is written to the memory 104 and a temperature at which the data is to be read from the memory 104. For example, when the controller 120 receives the request from the access device 180 to read the data 106, the controller 120 may retrieve the write temperature 108 from the memory 104 and may further instruct the temperature sensor 112 to perform a measurement operation and to provide the read temperature 162 to the controller 120. The trim adjuster 136 may be configured to use a difference between the read temperature 162 and the write temperature 108 to determine an index into the table 128. For example, a temperature difference 150 (illustrated as $\Delta T1$) may correspond to a first change in read voltages 152 ($\Delta VR1$). Different amounts of temperature difference may correspond to different amounts of read voltage offset values that may be retrieved from the table 128. The trim adjuster 136 may be configured to adjust a default value of one or more trim parameters based on offset values retrieved from table 128 and to provide the adjusted values to the memory device 103 for use during data retrieval from memory 104. The description above refers to a change in read parameters. For programming or writing parameters (i.e. for changing the programming trim), the trim adjuster 136 may change for example the programming pulse step size or width, the starting programming voltage or the verify levels. This may be done as a function of the programming temperature.

In response to the comparator 132 determining that a measured temperature 140 has reduced from being greater than the first threshold 142 to being less than or equal to the second threshold 144, the comparator 132 may indicate to the controller 120 that the marked data list 126 is to be refreshed (e.g., the second threshold 144 may be equal to the first threshold 142 or may be less than the first threshold 142). For example, the controller 120 may access the marked data list 126 and, for each entry in the marked data list 126, the controller 120 may instruct a data read of data corresponding to the entry from the memory 104 and a subsequent data write of the data to the memory 104. The controller 120 may also cause the ECC engine 170 to perform a data error correction operation to correct one or more errors that may occur in the data prior to storing the data back to the memory 104 at the lower temperature.

A range adjuster 138 may be configured to adjust one or more temperature thresholds, such as the first threshold 142 and the second threshold 144, based on the temperature history 130. For example, when the temperature history 130 indicates that a "normal" historical operating temperature range of the data storage device 102 has increased since setting the first threshold 142, the range adjuster 138 may adjust a value of the first threshold 142. Similarly, the range adjuster 138 may adjust one or more other temperature thresholds based on a history of the temperature measurements associated with the memory device 103. An example of range adjustment is described with reference to FIG. 2.

By performing one or more adjustments based on the difference between a write temperature 108 and a read temperature 162 of data 106 stored at the memory 104, based on whether the write temperature 108 is outside of a normal temperature range, or based on one or more other temperature related factors, an accuracy of reading data from the memory 104 may be increased. As a result, data correction provided by the ECC engine 170 may be enhanced, enabling a less powerful ECC engine to be used to accomplish an equivalent amount of data correction. Alternatively, or in addition, an increased error correction capability and therefore an increased useful life of the data storage device 102 may be obtained.

Figure 1B:
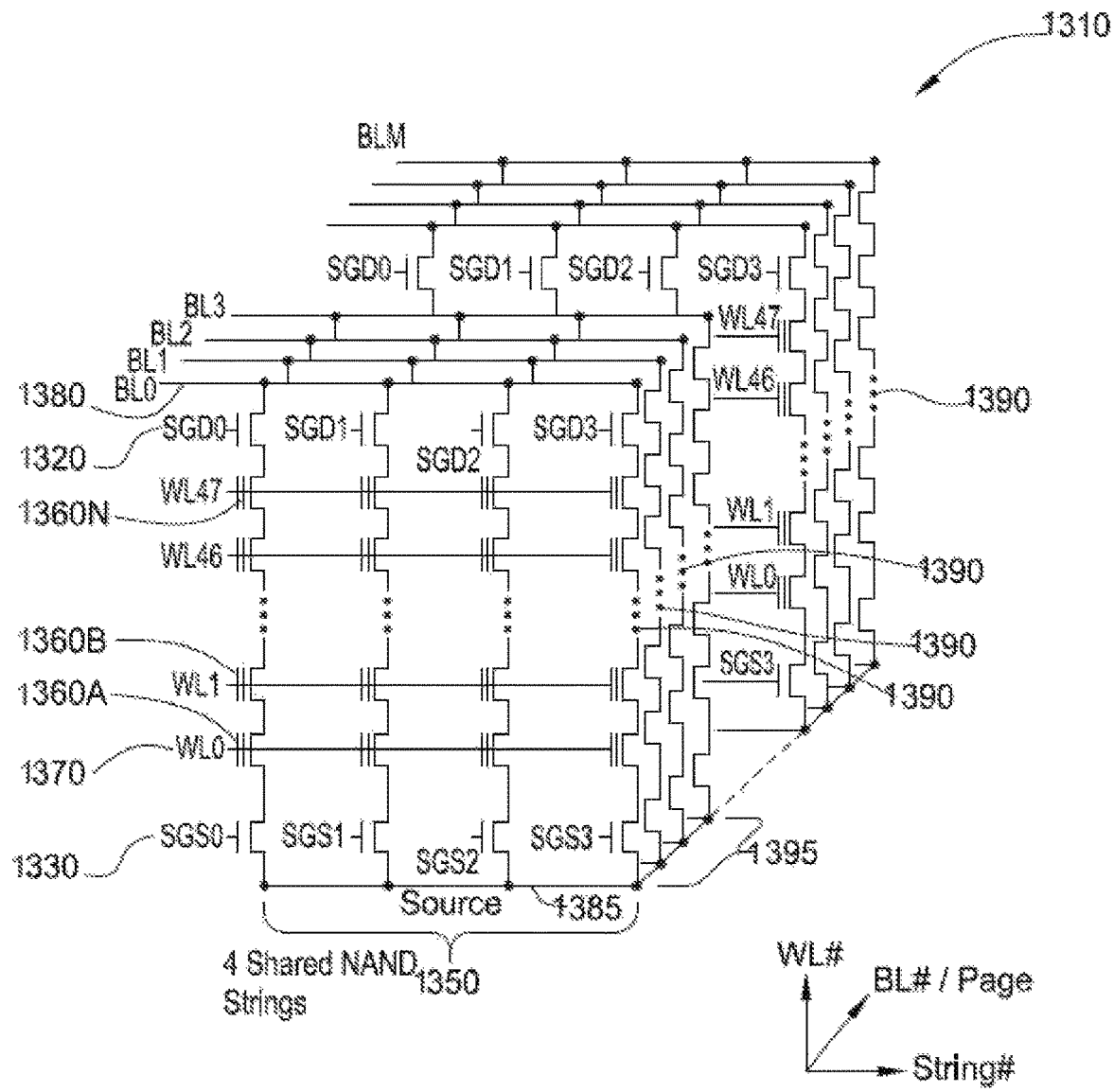
FIG. 1B is a schematic diagram of one example of a 3D memory array, according to one embodiment.
Figure 1C:
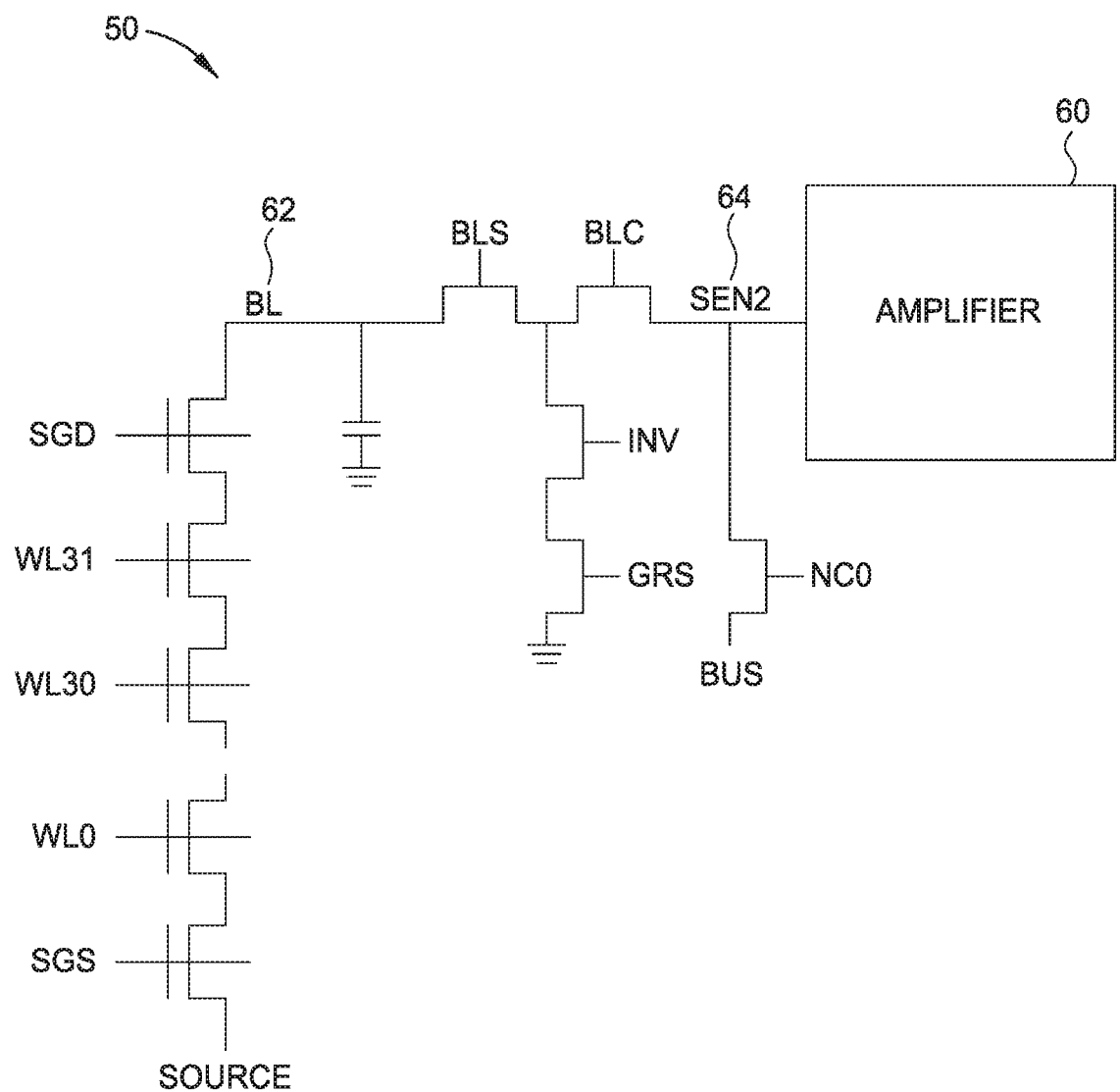
FIG. 1C illustrates an example of a sense module sensing the current and/or voltage of a bit line at node SEN2, according to one embodiment.

FIG. 1B is a schematic diagram of one example of a 3D memory array 1310, such as a 3D or vertical NAND memory array or a BiCS2 cell array as shown. Memory array 1310 is made up of a plurality of pages 1390. Each page 1390 includes a set of NAND strings 1350 (four NAND strings are shown). Each set of NAND strings 1350 is connected in common to a global bit line 1380. Each page 1390 has its own global bit line 1380 which number from BL0 to BLM depending on the number of pages 1390. Each NAND string 1350 includes a select gate drain transistor 1320 (SGD), a plurality of memory cells 1360A-1360N, and a select gate source transistor (SGS) 1330. A common source 1385 is shared between each shared NAND string 1350. A row of memory cells 1360A-1360N are connected in common to a word line (WL) 1370. The number of word lines 1370 (WL0, WL1, etc.) is dependent upon on the number of memory cells 1360A-1360N in a NAND string 1350.

Memory cells 1360A-1360N are made up of a transistor that has a charge storage element to store a given amount of charge representing a memory state. The memory cells 1360A-1360N may be operated in a single-level cell (SLC) storing 1 bit of memory per cell, a X2 cell storing 2 bits of memory per cell, a X3 cell storing 3 bits of memory per cell, a X4 cell storing 4 bits of memory per cell, or any type of memory cell storing any number of bits per cell. Page 1390 of FIG. 1B is a group of memory cells 1360A-1360N that are programmed as a group. Multiple pages 1390 make up a block 1395. The memory cells 1360A-1360N in an individual block 1395 are typically erased together. A page is the smallest write unit, and a block is the smallest erasure unit.

Embodiments described herein are not limited to three dimensional memory arrays described in FIG. 1B but cover all relevant memory structures as understood by one skilled in the art. Other arrays are possible, such as a three-dimensional NAND string formed in a U-shape, two-dimensional memory arrays, memory arrays in a NOR configuration, memory arrays made of ReRAM memory cells, or other memory arrays made of storage class memory. Multiple memory arrays may be formed on separate chips and then packaged together to form a stacked-chip memory device. Multiple memory arrays, including mixed types of memory arrays, may be coupled together to form the non-volatile memory of a SSD.

Figure 10:
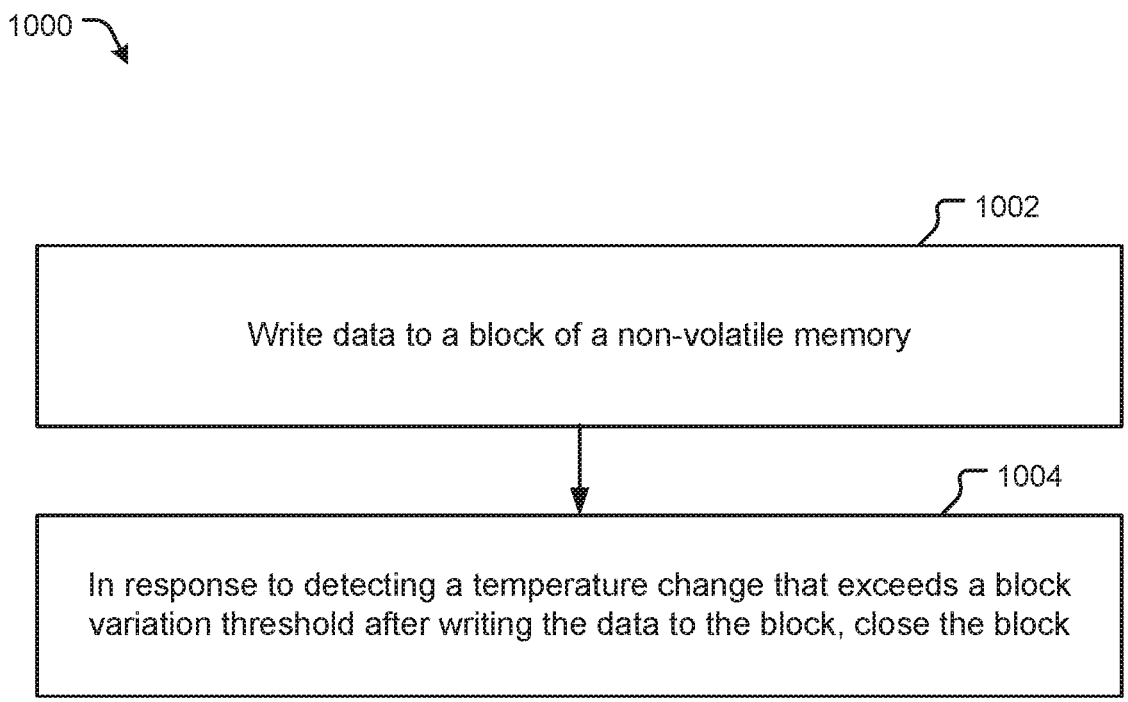
FIG. 10 is a flow diagram of a particular example of a method of temperature-based control that may be performed by the data storage device of FIG. 1A, according to one embodiment.

FIG. 10 illustrates a schematic diagram 50 of a sense module amplifier 60 sensing the current and/or voltage of BL 62 at node SEN2 64. Sense amplifier integration time of node SEN2 64 is the time period in which the voltage or current is measured.

Figure 2:
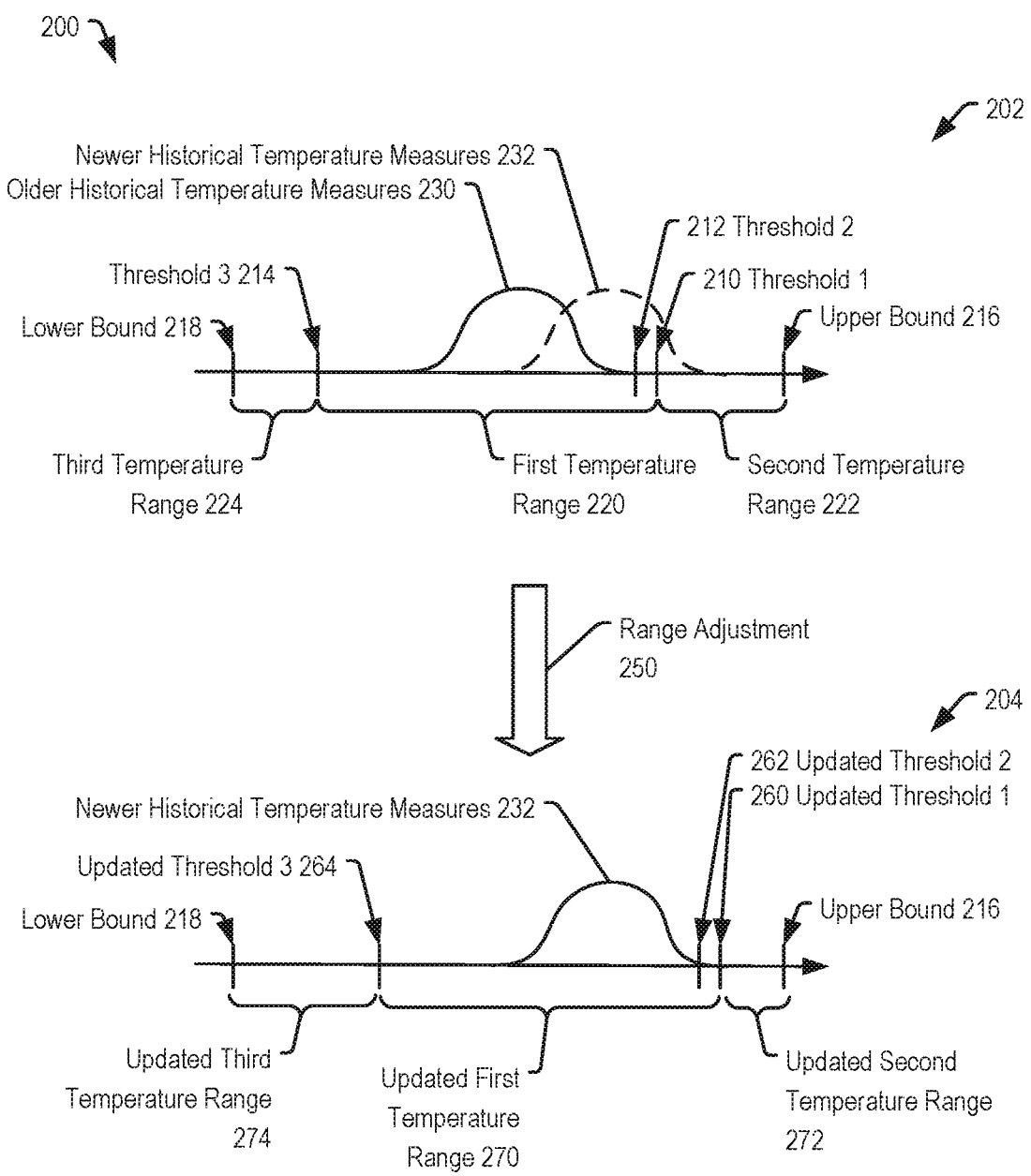
FIG. 2 is a diagram illustrating two particular examples of temperature ranges associated with the data storage device of FIG. 1A, according to one embodiment.

Referring to FIG. 2, an example 200 of performing temperature range adjustment 250 is depicted. For example, a first graph 202 may indicate a distribution of historical temperature measures 230 associated with storage of data or retrieval of data from the memory device 103 of FIG. 1A. As illustrated, the historical temperature measures 230 may be considered an "older" set of historical temperature measures as compared to a "newer" (e.g., more recent) set of historical temperature measures 232. Based on the older historical temperature measures 230, three or more temperature ranges may be determined, such as a first temperature range 220, a second temperature range 222, and a third temperature range 224. For example, the first temperature range 220 may correspond to a "normal" temperature range. The second temperature range 222 may correspond to an "abnormal" temperature range of temperatures that exceed a highest temperature of the first temperature range 220. The third temperature range 224 may be considered an "abnormal" temperature range of temperatures that are less than the first temperature of the first temperature range 220.

The first temperature range 220 may have an upper boundary indicated by a first threshold 210. For example, the first threshold 210 may correspond to the first threshold 142 of FIG. 1A. A second threshold 212 is also illustrated, which may correspond to the second threshold 144 of FIG. 1A. Temperatures exceeding the first threshold 210 may be considered to be in the "abnormal" temperature range indicated by the second temperature range 220. The second temperature range 220 may have an upper bound 216, beyond which reliability of the data storage device 102 may be jeopardized. For example, design of the data storage device 102 may be determined to satisfy performance based metrics when operating at a temperature between the upper bound 216 and a lower bound 218. A third threshold 214 may indicate a boundary between the first temperature range 220 and the third temperature range 224.

FIG. 2 continues with a graph 204 of a distribution of historical temperature measures after a range adjustment 250. In response to the range adjustment 250 determining that the distribution of newer historical temperature measures 232 includes a portion of measurements, the range adjuster 138 may adjust one or more of the thresholds 210-214. For example, as depicted in the second graph 204, the range adjustment 250 may result in the first threshold 210 being increased to a first updated threshold 260. The first updated threshold 260 may be positioned such that a particular percentage of the newer historical temperature measures 232 are at lower temperatures than the first updated threshold 260. For example, the first updated threshold 260 may be selected so that one percent, two percent, one-half of a percent, 10 percent, or any other portion of the newer historical temperature measures 232 exceed the first updated threshold 260.

The second updated threshold 262 may also be adjusted. For example, an offset amount that is applied to the first threshold 210 to generate the first updated threshold 260 may also be applied to the second threshold 212 to generate the second updated threshold 262. Alternatively, one or more or other techniques may be used to determine the second updated threshold 262, such as by selecting the second updated threshold 262 based on a proportion of the new historical measurement data 232 being greater than the second updated threshold 262.

Increasing the first updated threshold 260 may decrease the second temperature range 222 to form a second updated temperature range 272. The first temperature range 220 may be updated to form the first updated temperature range 270 that spans from the first updated threshold 260 to a third updated threshold 264. For example, as illustrated, the first temperature range 220 may be shifted based on the shift of the first threshold 210 to the updated first threshold 260. Thus, a temperature difference between the first updated threshold 260 and the third updated threshold 264 may be equal to a temperature difference between the first threshold 210 and the third threshold 214.

The third temperature range 224 may be adjusted to form the updated third temperature range 274. For example, the lower bound 218 may remain unadjusted, and the updated third temperature range 274 may span between the lower bound 202 and the third updated threshold 264.

Because temperature effects on data storage and retrieval may be primarily based on a temperature difference between write temperatures and read temperatures, by adjusting the temperature ranges 220-224 based on a recent history of historical temperature measures, a proportion of data write and/or data reads occurring in the abnormal temperature range(s) may be reduced, resulting in a higher performance and lower error rates as compared to operation using the unadjusted temperature ranges 220-224.

FIG. 3 depicts an example 300 of an implementation that may be used in the data storage device 102 of FIG. 1A. An adjusted read voltage may be generated by or based on a sum of a default value of the read voltage 301 and an offset retrieved from an offset table 302. For example, in the offset table 302 may correspond to the table 128 of FIG. 1A. The offset table 302 includes multiple columns, each column corresponding to a respective read temperature range. The offset table 302 also includes a number of rows, each row corresponding to a respective write temperature range.

An example of temperature ranges that may be used as the read temperature ranges and the write temperature ranges is depicted in a range table 304. For example, range 0 may span from a temperature of −25 degrees (e.g., degrees Celsius) to a temperature of 0 degrees. Range 1 may correspond to a temperature in the range from one degree to 25 degrees. Range 2 may correspond to a temperature between 26 and 50 degrees. Range 3 may correspond to a temperature from 51 degrees to 75 degrees. Range 4 may correspond to a temperature from 76 degrees to 100 degrees.

As illustrated, the offset table 302 omits values for entries that correspond to matching temperature ranges and read temperature ranges. For example, an entry of the offset table 302 corresponding to a read temperature in range 1 and a write temperature in range 1 includes a value "N/A", meaning that the entry may be omitted from the table, may be empty of data, or may include zero values (e.g., zero offset to the default value 301). Other entries of the offset table 302 include offset values that may be negative values or may be positive values. When the read temperature range corresponds to a lower temperature range than the write temperature range, the offset stored in the table entries may have negative values, such as Offset_Neg_1. Similarly, for table entries where the write temperature range exceeds the read temperature range, values in the table entries may be positive, such as Offset_Pos_1.

As illustrated, for five temperature ranges, a total of four negative offset values and four positive offset values may be used. Thus, a reduced amount of data may be used to adjust for differences in read temperature ranges using a relatively small amount of offset data as compared to including a distinct offset value for each temperature difference. Although the offset table 302 is illustrated as having a table format, in other implementations the values of Offset_Pos_1-4 and Offset_Neg_1-4 may be stored in a data structure having a non-table format and may be selectively accessed based on differences between the read temperature range and the write temperature range.

Figure 4:
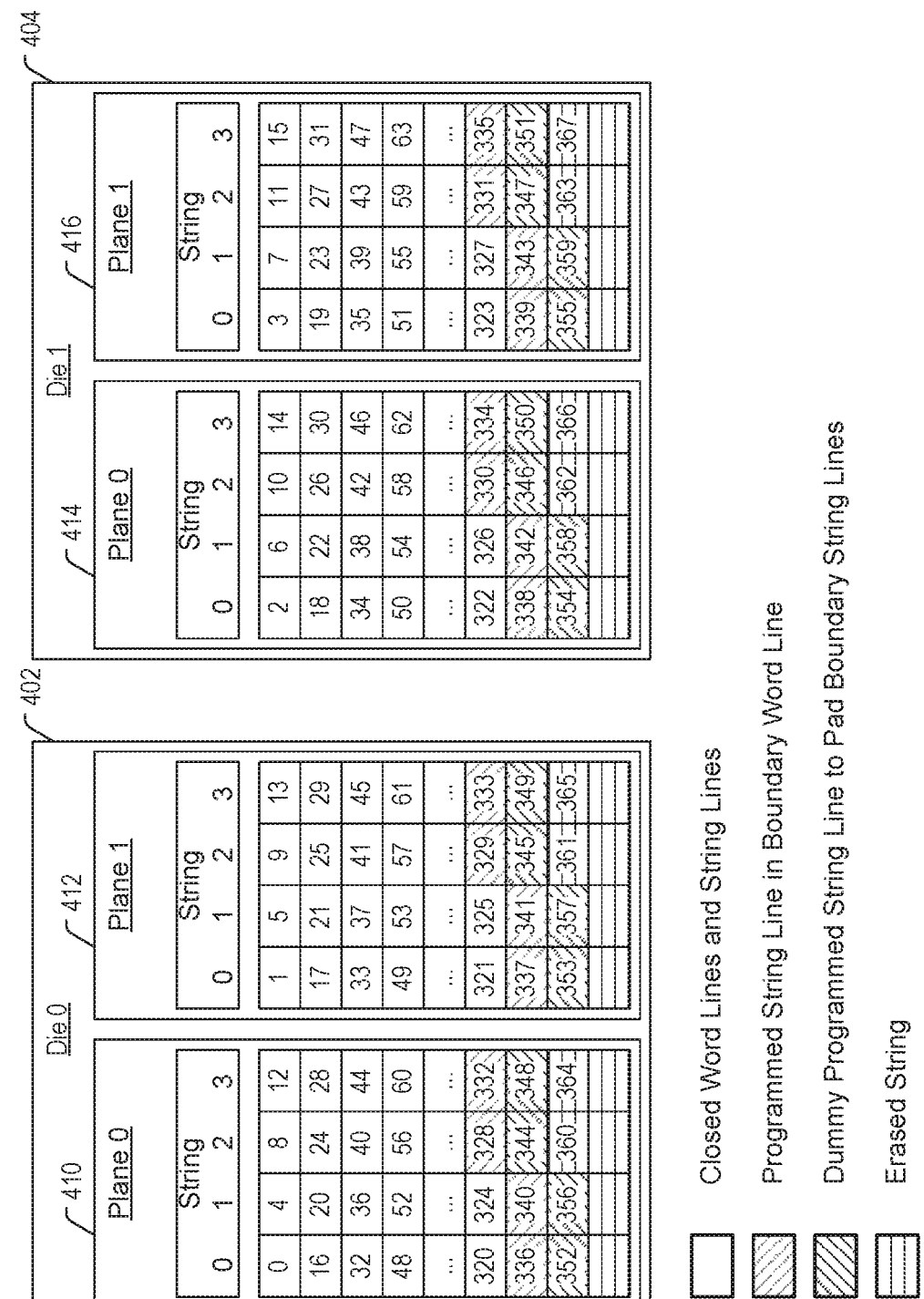
FIG. 4 is a diagram illustrating a particular example of a first configuration of multiple memory dies of the data storage device of FIG. 1A, according to one embodiment.

FIG. 4 illustrates an example 400 of the memory device 103 of FIG. 1A after the controller 120 has closed partially-written open blocks in response to programming temperature changes exceeding a threshold amount. For example, data written to the memory device 103 may be striped across multiple dies including a first die 402 and a second die 404. The first die 402 may include a first plane 410 and a second plane 412, and the second die 404 may include a first plane 414 and a second plane 416. Each of the planes 410, 412, 414, 416 may include multiple strings, illustrated as string 0, string 1, string 2 and string 3. Each string may correspond to a physical page and may be sized to include a sufficient number of storage elements of the memory 104 to store a sector of data, such as an ECC codeword. Each plane 410, 412, 414, 416 is illustrated as including a single representative block having 24 word lines and that may be operated as a 4-block "metablock" by the controller 120. Although a single block is illustrated for each plane 410, 412, 414, 416, it should be understood that each plane 410, 412, 414, 416 may have any number of blocks.

Data may be stored to the memory device 103 according to an order of page writes indicated as page numbers within the respective planes 410, 412, 414, 416. For example, a first page of data ("page 0") may be written to string 0 of the first plane 410 of the first die 402. A second page of data may be written to a first string of the second plane 412 of the first die 402. A third page of data may be written to a first string of the first plane 414 of the second die 404, and a fourth page of data may be written to a first string of the second plane 416 of the second die 404.

As data is received from the access device 180 to be stored at the memory device 103, the controller 120 may monitor a temperature and compare a change in temperature to a block variation threshold. For example, in response to detecting a temperature change that exceeds a block variation threshold after writing data to a block, such as a the illustrated block of the second plane 416 of the second die 404 that includes the data storing page 327, the controller 120 may be configured to close the block to prevent further write operations to an unused portion of the block (or of the multiple blocks when operated as a metablock). For example, each block may initially include all erased word lines, and as data is received, the word lines may be written as illustrated in FIG. 4, until page 327 is written to the memory. Upon writing page 327, a temperature measurement associated with page 327 may exceed a temperature measurement associated with writing page 0 to the memory 103 by more than a block variation threshold. In response to detecting the temperature change between writing page 327 and writing page 0 has exceeded the block variation threshold, the controller 120 may be configured to write dummy data to pages labeled 344-359 to form a boundary that isolates the last written valid data of each block, illustrated as pages 328-343, from erased word lines that remain unwritten after closing the block.

By writing the dummy data to the boundary word lines, enhanced data retention may be maintained upon closing the block. By closing the block when the temperature variation has exceeded the threshold, reading data from the block may be accomplished using a common set of read parameters, without having to adjust read parameters for different word lines of the block. Thus, by constraining a write temperature range for data written to the blocks, a parameter adjustment range for data read from the block may be reduced.

Figure 5:
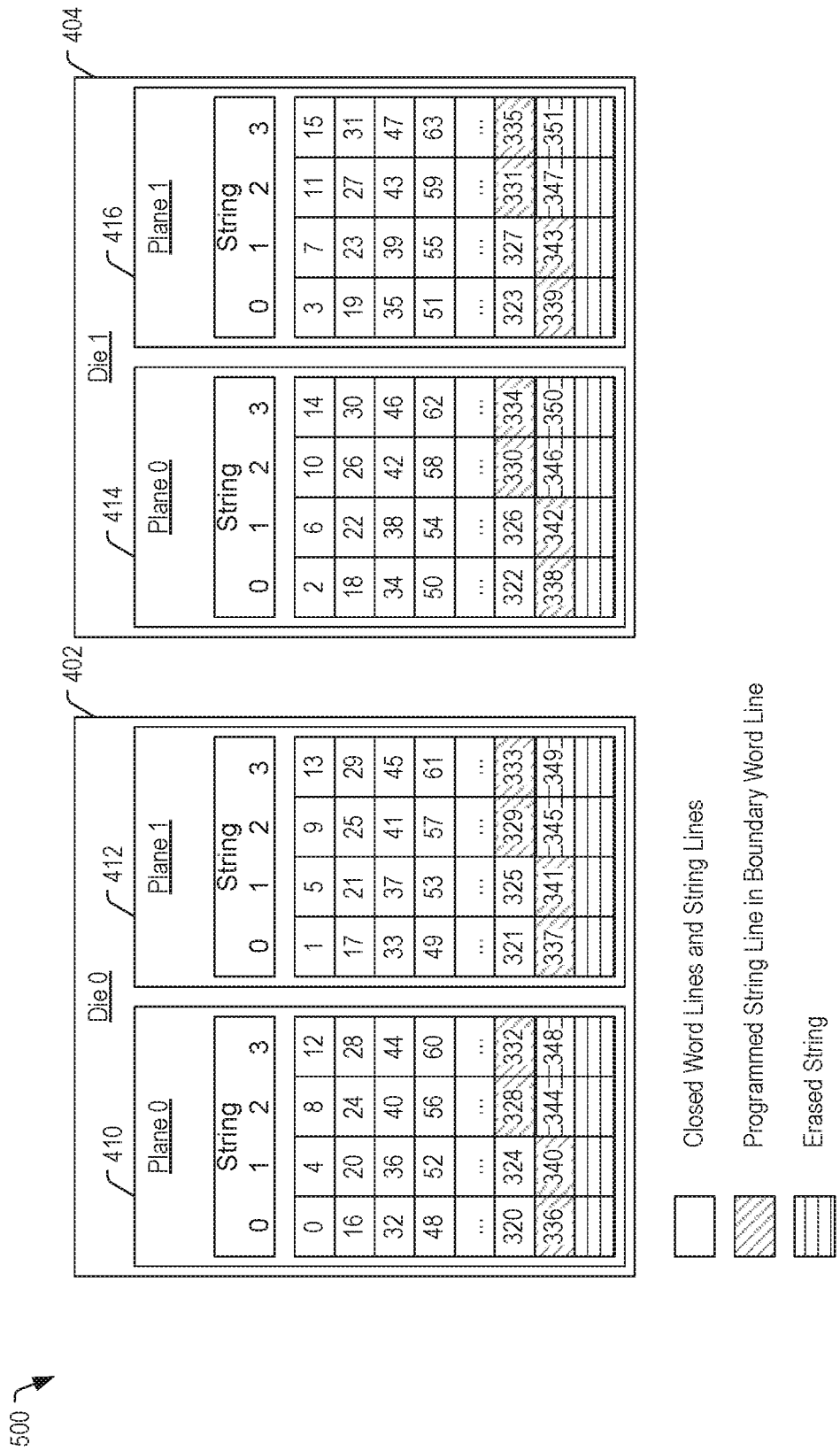
FIG. 5 is a diagram illustrating a particular example of a second configuration of multiple memory dies of the data storage device of FIG. 1A, according to one embodiment.

FIG. 5 depicts another example of closing one or more blocks in response to the temperature variation within the block exceeding a particular amount. The example 500 differs from the example 400 in that the controller 120 does not write dummy data at the boundary following the last valid data written to the memory 103. Although closing the block according to the example 500 may be performed more quickly than the example 400 because less data is written (i.e., the dummy data is omitted), an improved data retention and reduced error rate may be obtained in the example 400 by use of the dummy data.

Figure 6:
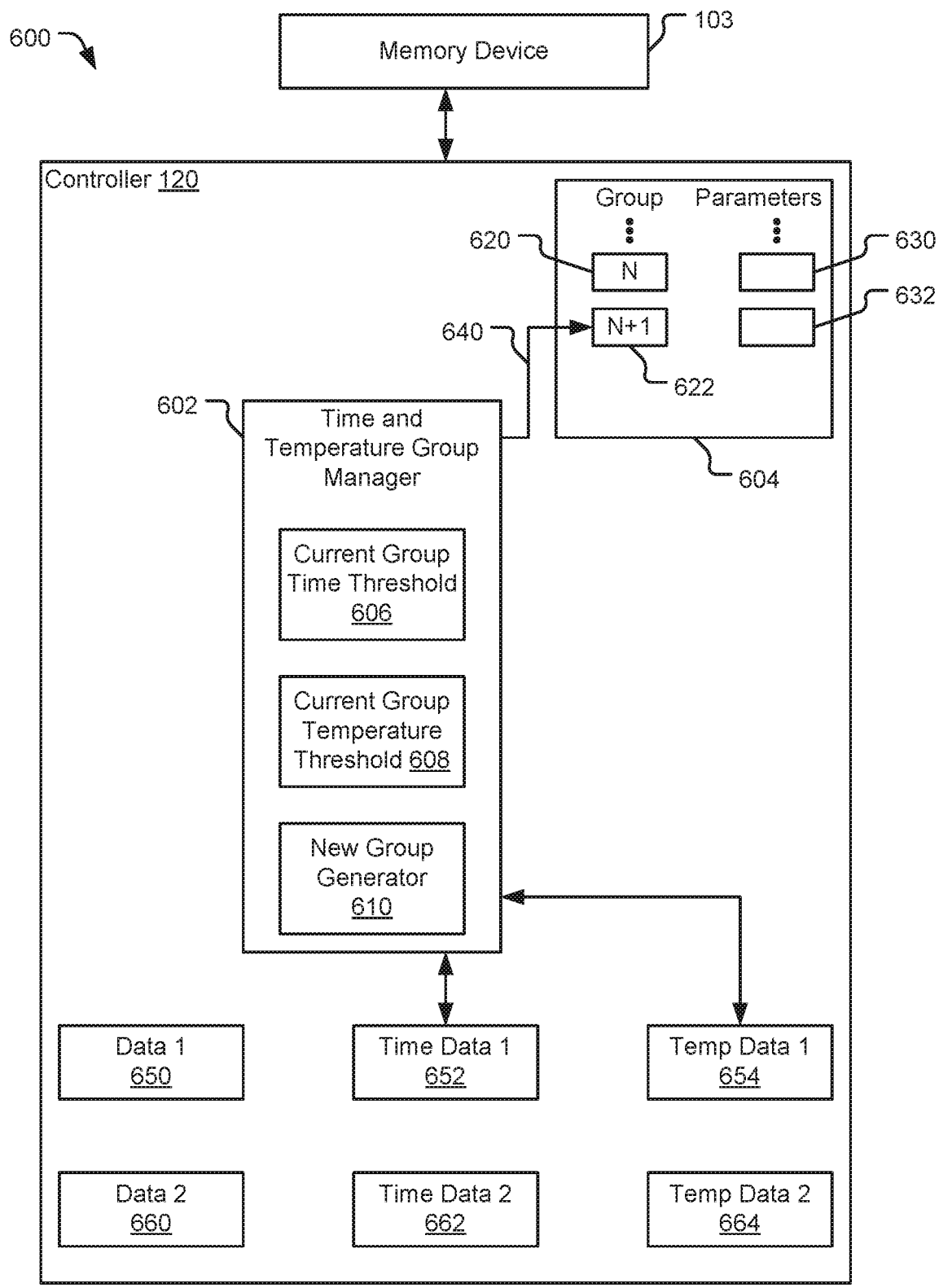
FIG. 6 is a block diagram of an illustrative example of the data storage device of FIG. 1A, according to one embodiment.

FIG. 6 depicts an example of a system 600 that may be implemented in the data storage device 102 of FIG. 1A. For example, the system 600 includes the memory device 103 and the controller 120 of FIG. 1A. The controller 120 includes a time and temperature group manager 602 that is configured to access a data structure 604, such as a table or array that associates indicators of groups of data to memory access parameters associated with the groups of data. For example, a group of data 620 labeled group "N" may be associated with a first set of access parameters 630, such as a first set of read voltage parameters, a first set of write voltage parameters, a first set of erase parameters, or combination thereof. A second group indicator 622 is labeled group "N+1" and is associated with a second set of memory access parameters 632.

The time and temperature group manager 602 may be configured to maintain a group indication pointer 604 that indicates a current group to be used as storage data to the memory device 103. For example, when the group indication pointer 640 points to group indicator N 620, data received from the access device 180 to be stored in the memory device 103 may be associated with group N and the first set of parameters 630 may be used for data write and data retrieval at the memory device 103. The time and temperature group manager 602 may be configured to update the group indication pointer 640 to point to a next group based on detecting one or more events.

For example, a group may have a time threshold 606 that is compared against a time measurement (e.g., a current time). In response to the current time exceeding the current group time threshold 606, the time and temperature group manager 602 may cause a new group to be generated by a new group generator 610. Alternatively, or in addition, an upper and/or lower temperature range of the current group may be indicated based on a current group temperature threshold 608. For example, when the current group is created, a measured temperature of the memory device 103 may be obtained and used to generate a current group temperature threshold 608. For example, the current group temperature threshold 608 may be used to constrain an amount of temperature variation that occurs while data is written. For example, the current group may be constrained to a particular temperature range, such as a 20 degree range that is centered on a write temperature for the group.

To illustrate, when a new group is created, a temperature T_new of the memory device 103 may be measured. An upper temperature T_hi for the group may be computed as T_hi=T_new+10, and an lower temperature T_lo for the group may be computed as T_lo=T_new−10. The current group temperature threshold 608 may include multiple elements (e.g., a vector) including T_lo and T_hi. In this case, the current group temperature threshold is "exceeded" when a measured temperature is greater than T_hi or when the measured temperature is less than T_lo. In other implementations, the current group temperature threshold 608 may represent a difference threshold, such as 10 degrees, and may be "exceeded" when an absolute value of a difference between a measured temp T_meas and T_new (e.g., |T_meas-T_new|) is greater than the difference threshold.

The new group generator 610 may be configured to populate a next group indicator and a next set of memory access parameters in the data structure 604. For example, when the current group is group N 620 and the current group time threshold 606 or the current group temperature threshold 608 is exceeded, the time and temperature group manager 602 may cause the new group generator 610 to generate the new group indicator N+1 622 and to determine the second memory access parameters 632 associated with group N+1.

During operation, the group indication pointer 640 may point to the first group indicator 620. Data that is received at the controller 120 to be written to the memory device 103 may be associated with time data and temperature data. For example, first data 650 may be received, associated with first time data 652 and first temperature data 654. For example, the first time data 652 may correspond to a chronological time, a count of memory accesses or write/erase cycles, a memory health metric, a count of power cycles, or some other indicator of time passage or memory usage. The first temperature data 654 may be received from a temperature sensor of the memory device 103, such as the temperature sensor 112 of FIG. 1A. The time and temperature group manager 602 may compare the first time data 652 to the current group time threshold 606 and compare the first temperature data 654 to the current group temperature threshold 608. In response to determining that the first time data 652 does not exceed the current group time threshold 606 and that the first temperature data 654 does not exceed the current group temperature threshold 608, the time and group temperature manager 602 may associate the first data 650 with the current group N, and may provide the first access memory parameter 630 to the memory device 103 for storage of the first data 650.

After storing the first data 650, the controller 120 may receive second data 660 associated with second time data 662 and second temperature data 664. Although the second time data 662 may not exceed the current group time threshold 606, the second temperature data 664 may exceed the current group temperature threshold 608.

In response to determining that the second temperature data 664 exceeds the current group temperature data 608, the time and temperature group manager 602 may generate a new group N+1, may generate the second group indicator 662, may determine the second memory access parameters 632, and may provide the second memory access parameters 632 to the memory device 103 for storing the second data 660 to the memory device 103. In addition, the time and temperature group manager 602 may update the group indication pointer 640 to point to the second group indication 662.

Another method that may be used for deciding whether to open a new time and temperature tag (e.g., create a new group with a new group indicator) is that whenever new data is programmed (e.g., a new block) then the block may be read with the read parameters associated with the current time & temperature tag. In case the BER measured for the read result does not fit to the BER indicated by the time & temperature tag, then a new time & temperature group may be created and the current block may be associated with the new group. For example, in cases where there was a power drop at the data storage device, and when the memory is powered up again, the data storage device may not know how much time has elapsed. Thus, the controller 120 may be configured to check whether the parameters associated the last time & temperature group/tag fit the newly programmed block.

By constraining the group associated with data to be within a common time range and also within a common temperature range, an applicability of the memory access parameters associated with the group may be maintained. For example, a variation of data characteristics of stored memory device 103 may remain relatively constrained such that the memory access parameters associated with the group may enable reliable reading and writing of data using the memory access parameters for the group. Adjustment of the memory access parameters, such as due to device usage or in response to temperature variation of the data storage device, may be performed by adjustment of the memory access parameters associated with the groups as opposed to adjustment of memory access parameters for individual data accesses to the memory device 103. This may be done by calibrating the parameters on representative pages of the group, instead of calibrating them on each page within the group, thus saving time and reducing maintenance complexity. The updating of the parameters of the different time and temperature groups may be done as maintenance operations performed in the background. Alternatively, the updating of parameters may be triggered by some event in the foreground (e.g., high BER observed during a host read).

Figure 7:
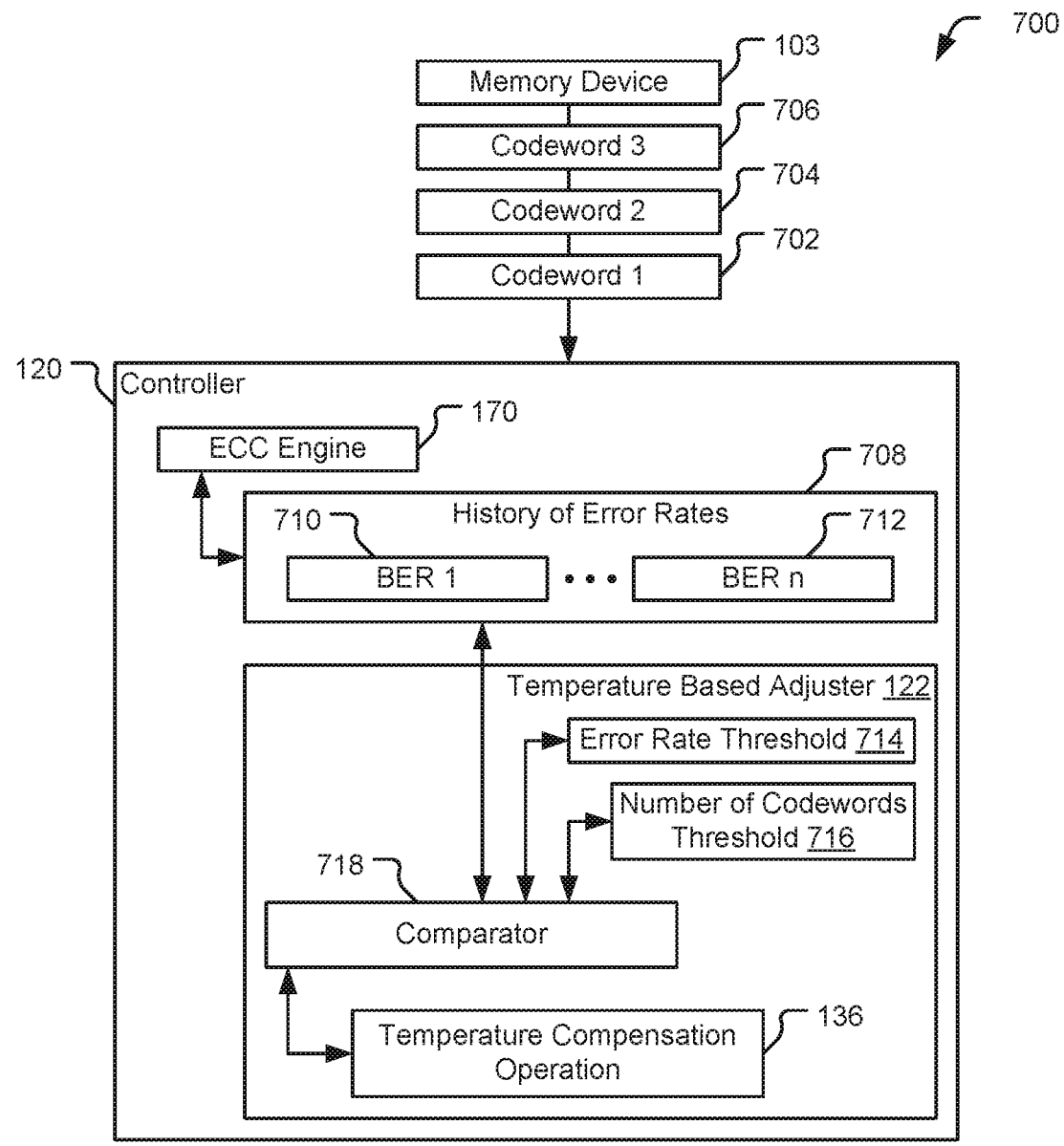
FIG. 7 is a block diagram of another illustrative example of the data storage device of FIG. 1A, according to one embodiment.

FIG. 7 is a block diagram of another illustrative example of the data storage device 102 of FIG. 1A. FIG. 7 illustrates a data storage device 700 that includes the memory device 103 that is coupled to the controller 120. The memory device 103 and the controller 120 may include or correspond to the memory device 103 and the controller 120 of FIG. 1A. The controller 120 may include the ECC engine 170 and the temperature-based adjuster 122. The controller 120 may be configured to read multiple codewords of data from the memory device 103. For example, the controller 120 may be configured to read a first codeword 702, a second codeword 704, and a third codeword 706 from the memory device 103. In other implementations, more than three codewords or fewer than three codewords may be read from the memory device 103.

The controller 120 may be configured to determine an error rate associated with reading the multiple codewords of data. For example, the ECC engine 170 of the controller 120 may be configured to determine a first error rate (e.g., a first bit error rate (BER) associated with reading the first codeword 702, a second error rate associated with reading the second codeword 704, and a third error rate associated with reading the third codeword 706. The controller 120 may be configured to maintain determined error rates as history of error rates data 708 that includes multiple error rates (e.g., multiple BERs). For example, the ECC engine 170 of the controller 120 may be configured to maintain the history of error rates data 708 (e.g., in a controller memory) that includes a first error rate 710 (e.g., BER 1) and an n-th error rate 712 (e.g., BER n). The number n of error rates included in the history of error rates data 708 may correspond to the number of codewords read from the memory device 103 during a particular operation (or set of operations).

The temperature-based adjuster 122 of the controller 120 may be configured to compare the error rate to a threshold error rate for a threshold number of codewords. For example, the temperature-based adjuster 122 may include a comparator 718 that is configured to compare one or more error rates from the history of error rates data 708 to an error rate threshold 714. In a particular implementation, the error rate threshold 714 is less than a threshold correctable error rate of the ECC engine 170. In response to determining that error rates exceed the error rate threshold 714 for a number of sequential codewords that exceeds a number of codewords threshold 716, the temperature-based adjuster 122 may initiate the temperature compensation operation 136. To illustrate, the number of codewords threshold 716 may be three, and in response to detecting that the first BER 710 (corresponding to the first codeword 702), a second BER (corresponding to the second codeword 704), and the n-th BER 712 (corresponding to the third codeword 706) each exceed the error rate threshold 714, the temperature-based adjuster 122 may initiate the temperature compensation operation 136. The temperature compensation operation 136 may cause one or more memory access parameters (such as the read voltage 164 of FIG. 1A) to be modified based on a temperature difference between a first temperature associated with writing the multiple codewords 702, 704, 706 to the memory device 103 (e.g., the first temperature is associated with a first time period, the first time period includes a write operation of the multiple codewords 702, 704, 706 to the memory 104), and a second temperature associated with reading the multiple codewords 702, 704, 706 from the memory device 103 (e.g., the second temperature is associated with a second time period, the second time period includes a read operation of multiple codewords 702, 704, 706 from the memory 104).

During operation, the controller 120 may read multiple codewords including the first codeword 702, the second codeword 704, and the third codeword 706 from the memory device 103. The controller 120 (e.g., the ECC engine 170) may detect error rates associated with the codewords 702, 704, 706. The error rates may be included in the history of error rates data 708. The controller 120 (e.g., the temperature-based adjuster 122) may compare the history of error rates data 708 to the error rate threshold 714. In response to detecting that error rates exceed the error rate threshold 714 for a number of sequential codewords that exceeds the number of codewords threshold 716, the controller 120 may initiate the temperature compensation operation 136 that modifies one or more memory access parameters based on a temperature difference between a first temperature associated with writing the multiple codewords 702, 704, 706 to the memory device 103 and a second temperature associated with reading the multiple codewords 702, 704, 706 from the memory device 103.

Figure 8:
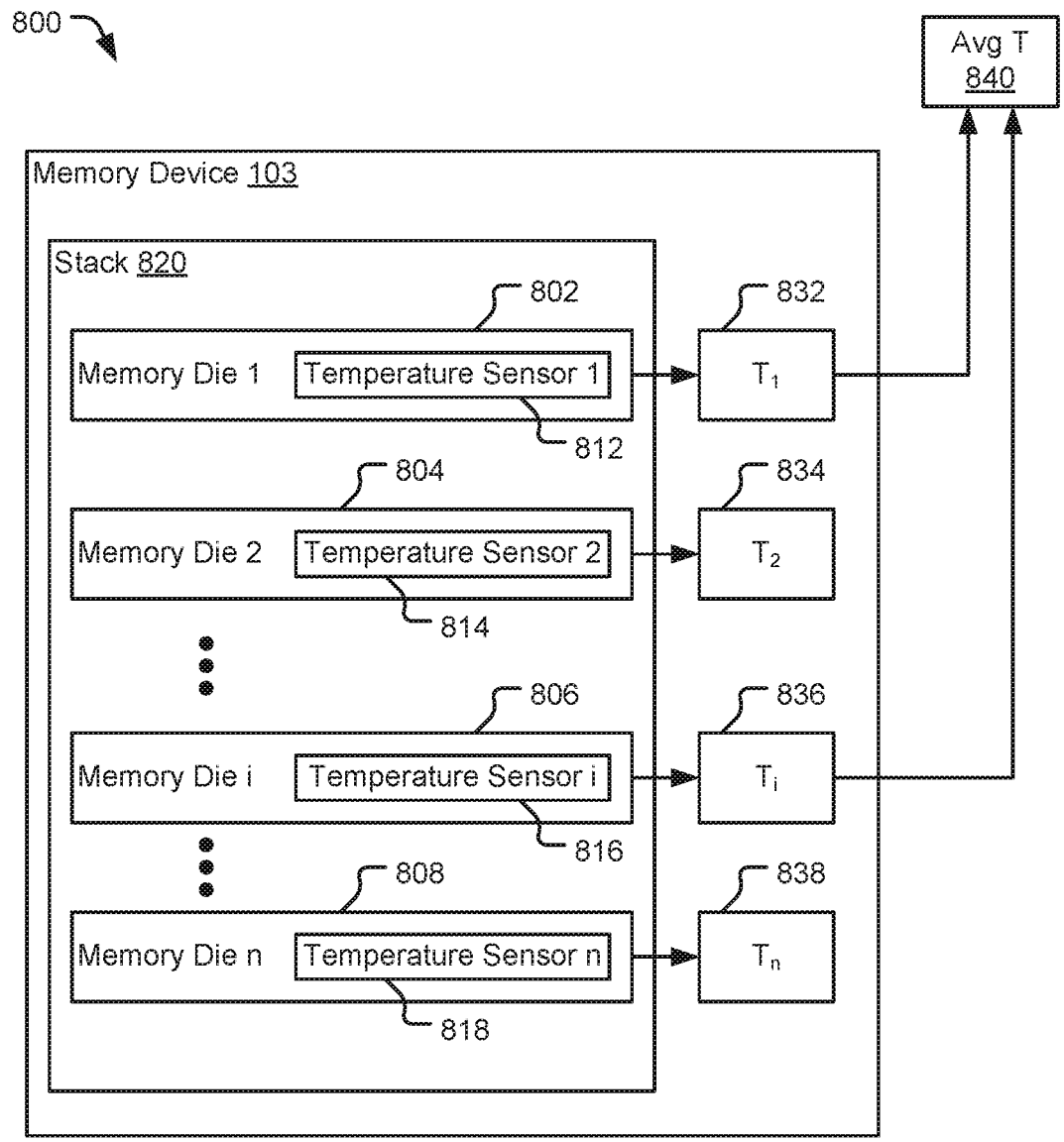
FIG. 8 is a diagram illustrating a particular example of a configuration of a memory device of the data storage device of FIG. 1A, according to one embodiment.

FIG. 8 is a diagram illustrating a particular example of a configuration of a memory device of the data storage device 102 of FIG. 1A. FIG. 8 illustrates a data storage device 800 that includes the memory device 103. The memory device 103 may include or correspond to the memory device 103 of FIG. 1A. The memory device 103 includes a stack 820 of memory dies. The stack 820 may include multiple memory dies, such as a first memory die 802, a second memory die 804, an i-th memory die 806, and an n-th memory die 808. In other implementations, the stack 820 may include more than n or fewer than n memory dies. In a particular implementation, the first memory die 802 is a top die of the stack 820, the n-th memory die 808 is a bottom memory die of the stack 820, and other memory dies such as the second memory die 804 and the i-th memory die 806 are "central" memory dies of the stack 820. As used herein, central memory dies refer to memory dies that are neither the top memory die nor the bottom memory die of the stack 820, such as to dies in a center of a stack, e.g., die 3 in a 5-die stack or dies 4 and 5 in an 8-die stack.

Each memory die of the stack 820 may include a corresponding temperature sensor. For example, the first memory die 802 may include a first die temperature sensor 812, the second memory die 804 may include a second die temperature sensor 814, the i-th memory die 806 may include an i-th die temperature sensor 816, and the n-th memory die 808 may include an n-th die temperature sensor 818. Each die temperature sensor of the die temperature sensors 812, 814, 816, 818 may be configured to generate an indicator of a temperature of the corresponding memory die. For example, the first die temperature sensor 812 may be configured to generate a first indicator 832 (T1) of a first temperature of the first memory die 802, the second die temperature sensor 814 may be configured to generate a second indicator 834 (T2) of a second temperature of the second memory die 804, the i-th die temperature sensor 816 may be configured to generate a third indicator 836 (T3) of a third temperature of the i-th memory die 806, and the n-th die temperature sensor 818 may be configured to generate a fourth indicator 838 (T4) of a fourth temperature of the n-th memory die 808. The memory device 103 may be configured to provide the indicators 832, 834, 836, 838 to the controller 120 for processing.

The controller 120 may be configured to receive multiple indicators from the memory device 103 and to determine an average based on the multiple indicators 832, 834, 836, 838. For example, the controller 120 may be configured to receive the first indicator 832 of the first temperature from the first die temperature sensor 812 and the third indicator 836 of the third temperature from the i-th die temperature sensor 816. The controller 120 may be configured to determine an average temperature 840 of the first temperature and the third temperature. In this manner, the average temperature may be determined based on a temperature of a non-center memory die (e.g., the first memory die 802) and a central memory die (e.g., the i-th memory die 806). Because the first memory die 802 is the coolest and the central die (e.g., the i-th memory die 806) is the hottest, the average temperature 840 may be representative of a range of temperatures of memory dies in the stack 820.

In some implementations, the average temperature 840 may be further based on indications (e.g., the second indication 834, the n-th indication 838, or both) of temperatures of other memory dies. As non-limiting examples, the average temperature 840 may be determined based on the first indicator 832 and the second indicator 834, the n-th indicator 838 and the second indicator 834, the n-th indicator 838 and the i-th indicator 836, or some other combination of two or more of the indicators 832, 834, 836, 838. The average temperature 840 may include or correspond to a mean temperature, a weighted mean temperature, a median temperature, a mode of the temperatures, or another statistical measure of central accuracy. The controller 120 may be further configured to determine a temperature range associated with a memory access based on the average temperature 840. In other implementations, the memory device 103 may be configured to perform the above-described actions of the controller 120. For example, the memory device 103 may determine the average temperature 840 and a temperature range of the stack 820 based on the average temperature 840.

During operation, temperature sensors of memory dies of the stack 820 may generate indications of a temperature of a corresponding memory die. For example, the first die temperature sensor 812 may generate the first indicator 832 of the first temperature of the first memory die 802, the second die temperature sensor 814 may generate the second indicator 834 of the second temperature of the second memory die 804, the i-th die temperature sensor 816 may generate the third indicator 836 of the third temperature of the i-th memory die 806, and the n-th die temperature sensor 818 may generate the fourth indicator 838 of the fourth temperature of the n-th memory die 808. The controller (e.g., the controller 120 of FIG. 1A) may receive indicators from the memory device 103 and may determine the average temperature 840. For example, the controller 120 may receive the first indicator 832 of the first temperature and the i-th indicator 836 of the third temperature and the controller 120 may determine the average temperature 840 for the first and third temperatures. The controller 120 may determine a temperature range associated with a memory access based on the average temperature 840. In another implementation, the memory device 103 may determine the temperature range and the average temperature 840, and the memory device 103 may send an indication of the temperature range to the controller 120.

Figure 9:
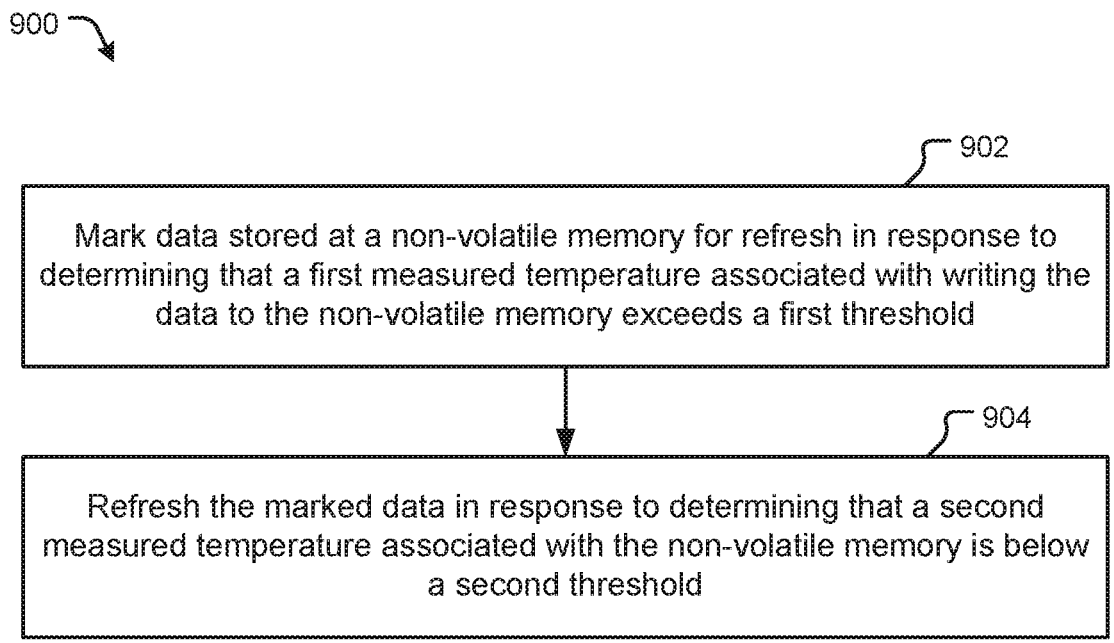
FIG. 9 is a flow diagram of a particular example of a method of refreshing data that may be performed by the data storage device of FIG. 1A, according to one embodiment.

FIG. 9 is a flow diagram of a particular example of a method 900 of refreshing data. The method 900 may be performed at a data storage device that includes a controller and a non-volatile memory. For example, the method 900 may be performed by the data storage device 102 of FIG. 1A. The method 900 includes, at block 902, marking data stored at the non-volatile memory for refresh in response to determining that a first measured temperature associated with writing the data to the non-volatile memory exceeds a first threshold. For example, the temperature-based adjuster 122 of FIG. 1A may determine that the write temperature 108 (e.g., a first measured temperature associated with writing the data 106 to the memory 104) exceeds the first threshold 142. In this example, in response to determine that the write temperature 108 exceeds the first threshold 142, the temperature-based adjuster 122 may mark the data 106 by storing the refresh flag 110. Alternatively or in addition, the temperature-based adjuster 122 may store an indicator (or an identifier) of the data 106 in the marked data list 126.

The method 900 includes, at block 904, refreshing the marked data in response to determining that a second measured temperature associated with the non-volatile memory is below a second threshold. For example, the temperature-based adjuster 122 of FIG. 1A may receive the measured temperature 140 (e.g., the second measured temperature) from the temperature sensor 112. In this example, the comparator 132 may compare the measured temperature 140 to the second threshold 144. If a value of the measured temperature 140 is below a value of the second threshold 144, the temperature-based adjuster 122 may cause the marked data to be refreshed. To illustrate, if the value of the measured temperature 140 is below a value of the second threshold 144, the controller 120 may access the marked data list 126 to identify marked data. The controller 120 may also initiate data refresh operations, such as by sending the command 160 to cause the data 106 to be refreshed.

FIG. 10 is a flow diagram of a particular example of a method 1000 of temperature-based control. The method 1000 may be performed at a data storage device that includes a controller 120 and a non-volatile memory. For example, the method 1000 may be performed by the data storage device 102 of FIG. 1A. The method 1000 includes, at block 1002, writing data to a block of the non-volatile memory. For example, the data 106 of FIG. 1A may be written to a particular block of the memory 104. The method 1000 also includes, at block 1004, in response to detecting a temperature change that exceeds a block variation threshold after writing the data to the block, closing the block. For example, the temperature-based adjuster 122 may detect a temperature change (e.g., based on the measured temperature 140 and the temperature history 130). The comparator 132 may determine whether the temperature change exceeds a threshold. In response to determining that the temperature change exceeds a threshold, the controller 120 may close the block, such as described with reference to FIGS. 4-5. Closing the block may prevent write operations to an unused portion of the block. In some implementations, the controller 120 may write dummy data to a word line of the block prior to closing the block.

Figure 11:
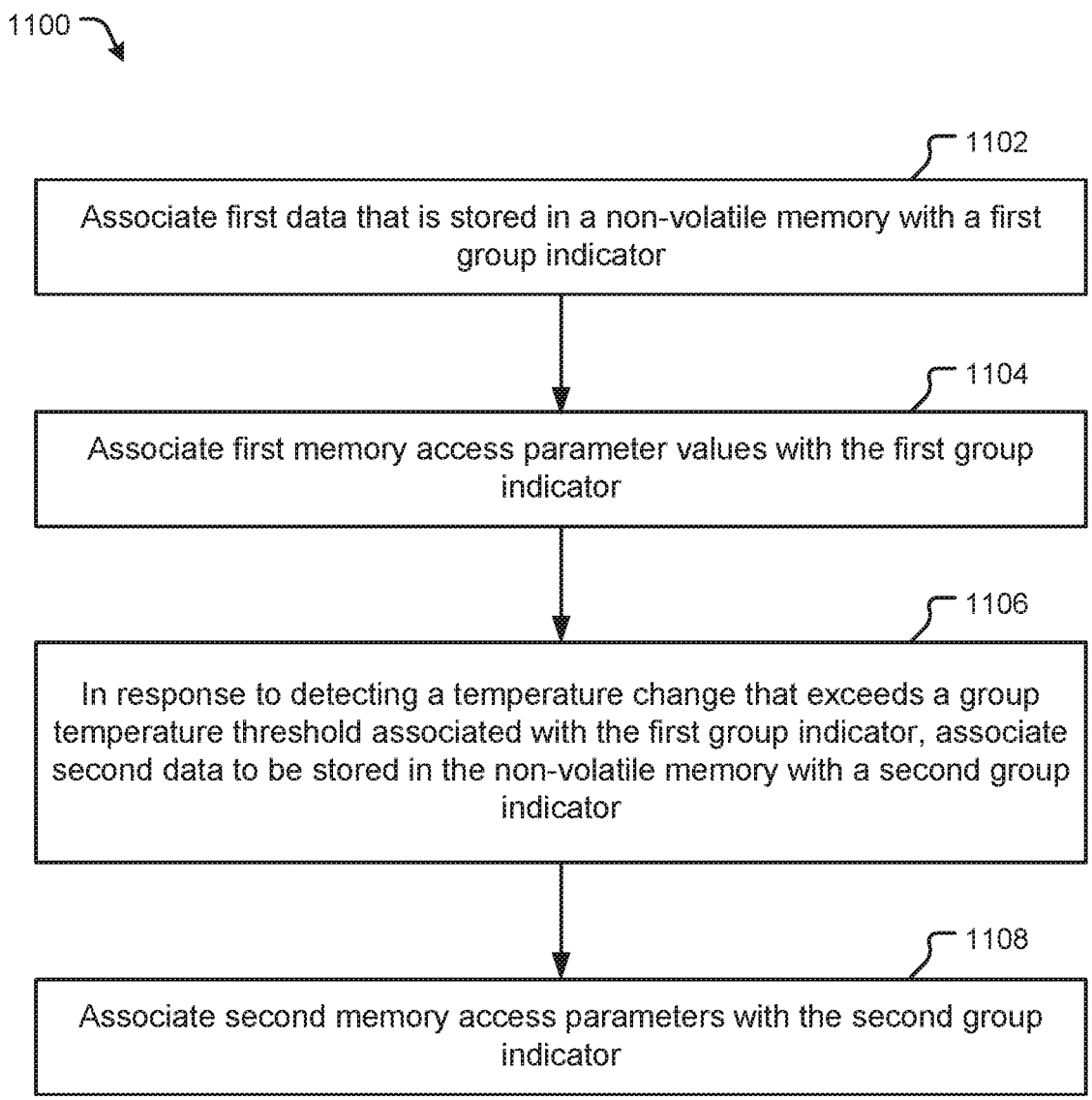
FIG. 11 is a flow diagram of another particular example of a method of temperature-based control that may be performed by the data storage device of FIG. 1A, according to one embodiment.

FIG. 11 is a flow diagram of another particular example of a method 1100 of temperature-based control. The method 1100 may be performed at a data storage device that includes a controller and a non-volatile memory. For example, the method 1100 may be performed by the data storage device 102 of FIG. 1A. The method 1100 includes, at block 1102, associating first data that is stored in the non-volatile memory with a first group indicator, and, at block 1104, associating first memory access parameter values with the first group indicator. For example, the time and temperature group manager 602 of FIG. 6 may associate the first data 650 with the first group 620. The time and temperature group manager 602 may also associate the first parameters 630 with the first group 620.

The method 1100 also includes, at block 1106, in response to detecting a temperature change that exceeds a group temperature threshold associated with the first group indicator, associating second data to be stored in the non-volatile memory with a second group indicator, and, at block 1108, associating second memory access parameters with the second group indicator. For example, the time and temperature group manager 602 of FIG. 6 may detect a temperature change (e.g., by comparing the first temperature data 654 and the second temperature data 664 to a first stored temperature for the first group 620). If the temperature change exceeds the current group temperature threshold 608, the time and temperature group manager 602 may generate a new group (e.g., the second group 622) and may associate the second data 660 with the second group 622. The time and temperature group manager 602 may also associate the second parameters 632 with the second group 622.

In a particular implementation, the time and temperature group manager 602 may store the group indicator pointer 640 which may indicate a group indicator (e.g., an indicator of the first group 620 or an indicator of the second group 622) to be associated with data (e.g., data received from the access device 180) that is to be written to the non-volatile memory. In this particular implementation, in response to detecting the temperature change, the time and temperature group manager 602 may update the group indicator pointer 640 to indicate the indicator of the second group 622.

Figure 12:
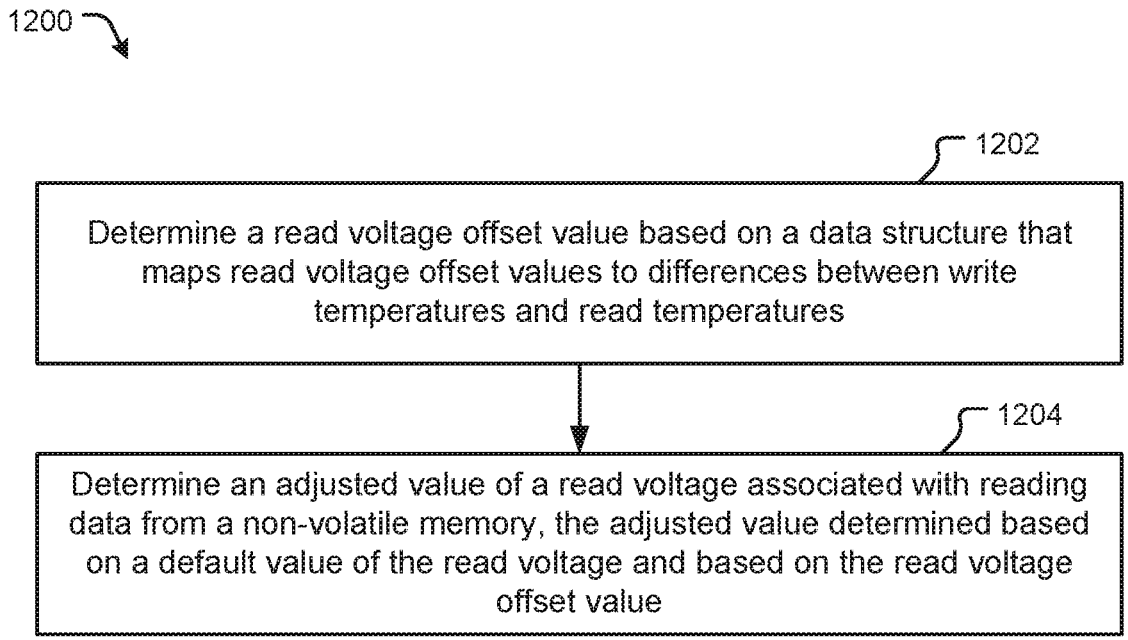
FIG. 12 is a flow diagram of another particular example of a method of determining a read voltage value that may be performed by the data storage device of FIG. 1A, according to one embodiment.

FIG. 12 is a flow diagram of another particular example of a method 1200 of determining a read voltage value. The method 1200 may be performed at a data storage device that includes a controller and a non-volatile memory. For example, the method 1200 may be performed by the data storage device 102 of FIG. 1A.

The method 1200 may include, at block 1202, determining a read voltage offset value based on data structure that maps read voltage offset values to differences between write temperatures and read temperatures. For example, the data structure may include the table 128 and temperature-based adjuster 122 may perform a look-up operation to read the table 128 to determine a read voltage offset value, such as the first read voltage offset value 152, which corresponds to a particular temperature difference, such as the first temperature difference 150.

In a particular implementation, each entry of the table is accessible according to a write temperature range and a read temperature range. In this particular implementation, the table omits read voltage offset values for entries that correspond to matching write temperature ranges and read temperature ranges. For example, an offset value can be determined from the offset table 302 based on a write temperature range and a read temperature range. Further, the offset table 302 omits read voltage offset values for table entries that correspond to matching write temperature ranges and read temperature ranges. The method 1200 may also include, at block 1204, determining an adjusted value of a read voltage associated with reading data from the non-volatile memory. The adjusted value determined based on a default value of the read voltage and based on the read voltage offset value. For example, the trim adjuster 136 may use the read voltage offset value determined from the table 128 and a default value of the read voltage (e.g., the default value 301 of FIG. 3) to determine the adjusted value of the read voltage.

Figure 13:
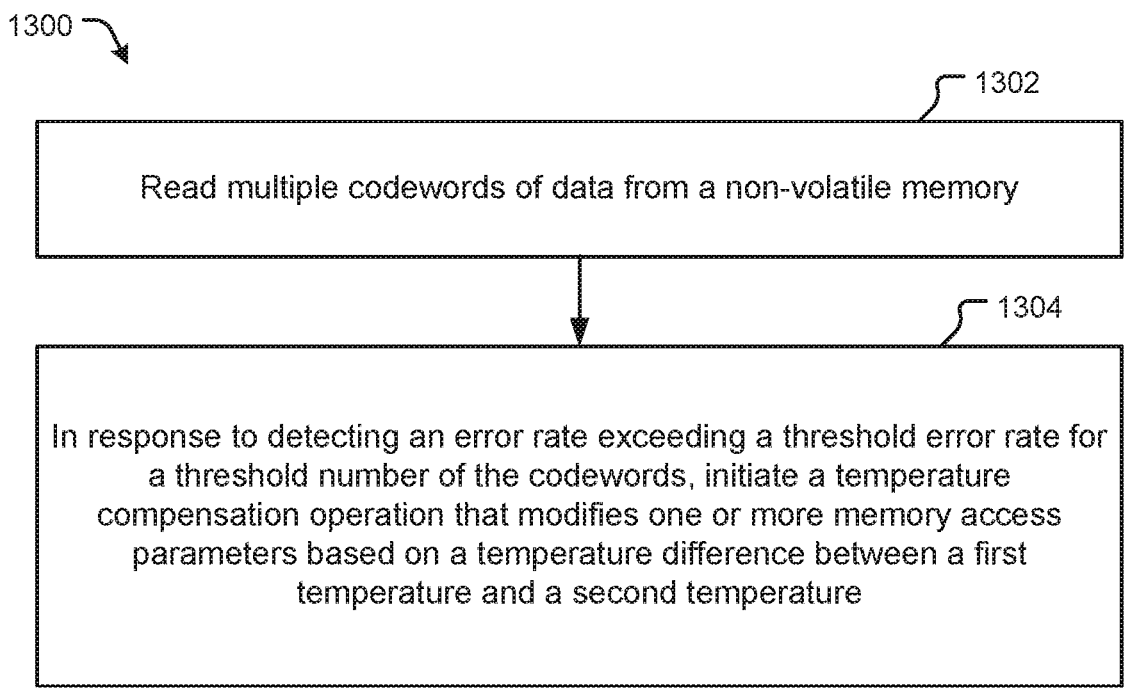
FIG. 13 is a flow diagram of another particular example of a method of temperature-based control that may be performed by the data storage device of FIG. 1A, according to one embodiment.

FIG. 13 is a flow diagram of another particular example of a method 1300 of temperature-based control. The method 1300 may be performed at a data storage device that includes a controller and a non-volatile memory. For example, the method 1300 may be performed by the data storage device 102 of FIG. 1A. The method 1300 includes, at block 1302, reading multiple codewords of data from the non-volatile memory. For example, as illustrated in FIG. 7, the controller 120 may read multiple codewords, such as the first codeword 702, the second codeword 704, and the third codeword 706 from the memory device 103.

The method 1300 also includes, at block 1304, in response to detecting an error rate exceeding a threshold error rate for a threshold number of the codewords, initiating a temperature compensation operation that modifies one or more memory access parameters based on a temperature difference between a first temperature and a second temperature. For example, the ECC engine 180 may generate the history of error rates data 708. In this example, the temperature-based adjuster 122 may compare the history of error rates data 708 to the error rate threshold 714 and to the number of codewords threshold 716. In a particular implementation, the threshold error rate is less than a threshold correctable error rate of the ECC engine 180. In response to detecting that an error rate exceeds a threshold error rate for a threshold number of the codewords, the temperature-based adjuster 122 initiates a temperature compensation operation 136. The temperature compensation operation 136 may cause one or more memory access parameters (such as the read voltage 164 of FIG. 1A) to be modified based on a temperature difference between a first temperature associated with writing the multiple codewords to the non-volatile memory and a second temperature associated with reading the multiple codewords from the non-volatile memory.

Figure 14:
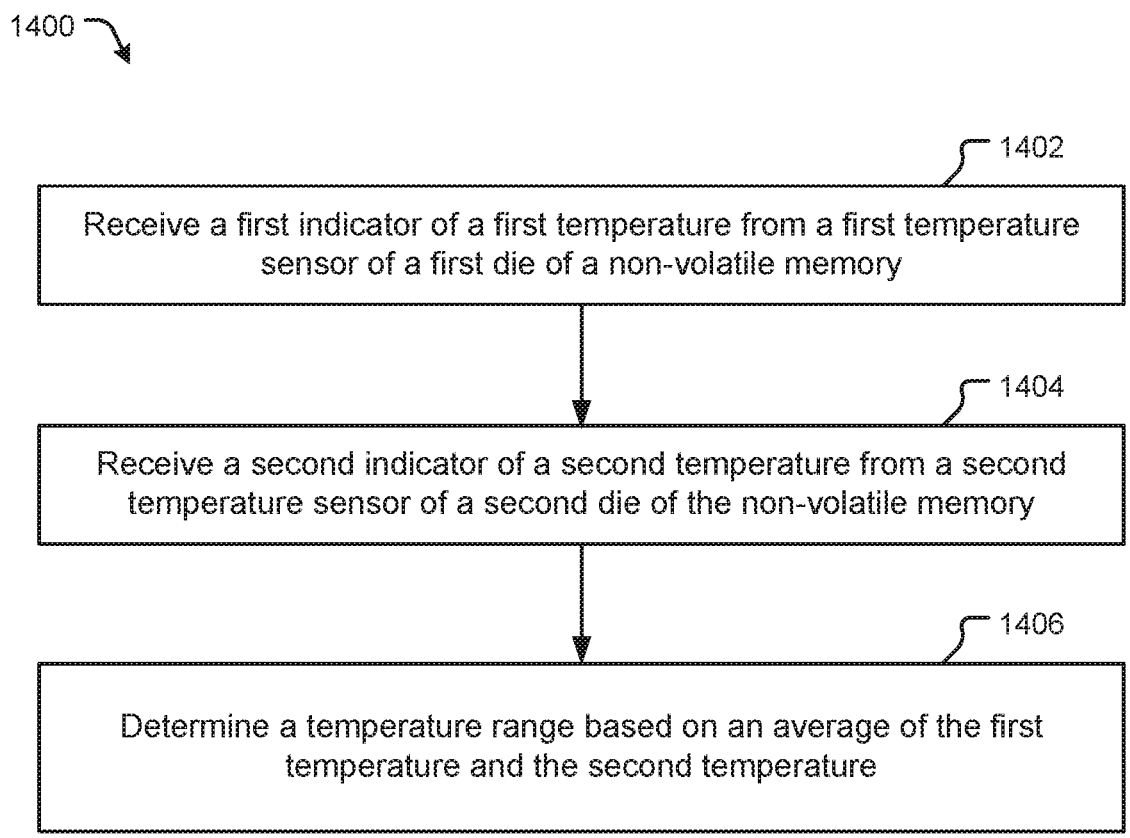
FIG. 14 is a flow diagram of another particular example of a method of determining a temperature range that may be performed by the data storage device of FIG. 1A, according to one embodiment.

FIG. 14 is a flow diagram of another particular example of a method 1400 of determining a temperature range. The method 1400 may be performed at a data storage device that includes a controller and a non-volatile memory. For example, the method 1400 may be performed by the data storage device 102 of FIG. 1A. The method 1400 includes, at block 1402, receiving a first indicator of a first temperature from a first die temperature sensor of a first die of the non-volatile memory. For example, the memory device 103 may include a stack 820 of memory die as in FIG. 8. In this example, the first memory die 802 may include the first die temperature sensor 812 which may generate and send the first indication 832, which indicates a temperature of the first memory die 802.

The method 1400 includes, at block 1404, receiving a second indicator of a second temperature from a second die temperature sensor of a second die of the non-volatile memory. For example, the second memory die may correspond to the i-th memory die 806 that includes the i-th die temperature sensor 816. The i-th die temperature sensor 816 may generate and send the i-th indication 836, which indicates a temperature of the i-th memory die 806. In this example, the stack 820 may also include other memory dies, one or more of which may include another temperature sensor. To illustrate, the stack 820 in FIG. 8 includes one or more memory dies stacked between the first memory die 802 and the i-th memory die 806, each of which may include a temperature sensor. The stack 820 includes one or more other dies, such the n-th memory die 808, which includes the nth temperature sensor 818. Thus, the first memory die 802 and the i-th memory die 804 may represent different portions of the stack 820. For example, in FIG. 8, the first memory die 802 is the top die of the stack 820 and the i-th memory die 804 is a central die (e.g., a memory die that is neither the top memory die nor the bottom memory die of the stack 820).

The method 1400 also includes, at block 1406, determining a temperature range based on an average of the first temperature and the second temperature. For example, the controller 120 or the memory device 103 may determine the average temperature 840 based on the first indication 832 of the first temperature and based on the i-th indication 836 of the second temperature. In some implementations, the average temperature 840 may be further based on indications (such as the second indication 834, the nth indication 838, or both) of temperatures of other memory dies. The average temperature 840 may include or correspond to a mean temperature, a weighted mean temperature, a median temperature, a mode of the temperatures, or another statistical measure of central tendency. The average temperature may be associated with a memory access, such as indicating a temperature condition prior to, during, or upon completion of reading data from the memory 104 or writing data to the memory 104.

Each memory cell, such as from memory 104 or memory array 1310 of FIG. 1B, may have different cross temperature-induced CVD widening due to different physical characteristics and different locations of each memory cell in the memory. For example, memory cells 360 in different layers or word line levels of a monolithic 3D flash memory array 1310 may experience different cross temperature-induced CVD widening due to variations during formation of the memory cells and due to different locations in the 3D array. In embodiments of the present disclosure, data storage devices are operable to compensation for the cross temperature-induced CVD widening by correcting the Vt per cell. Estimated TCOs or correction terms are determined per cell based upon Vt measurements per cell under different read parameters at a read temperature in operation.

Figure 15:
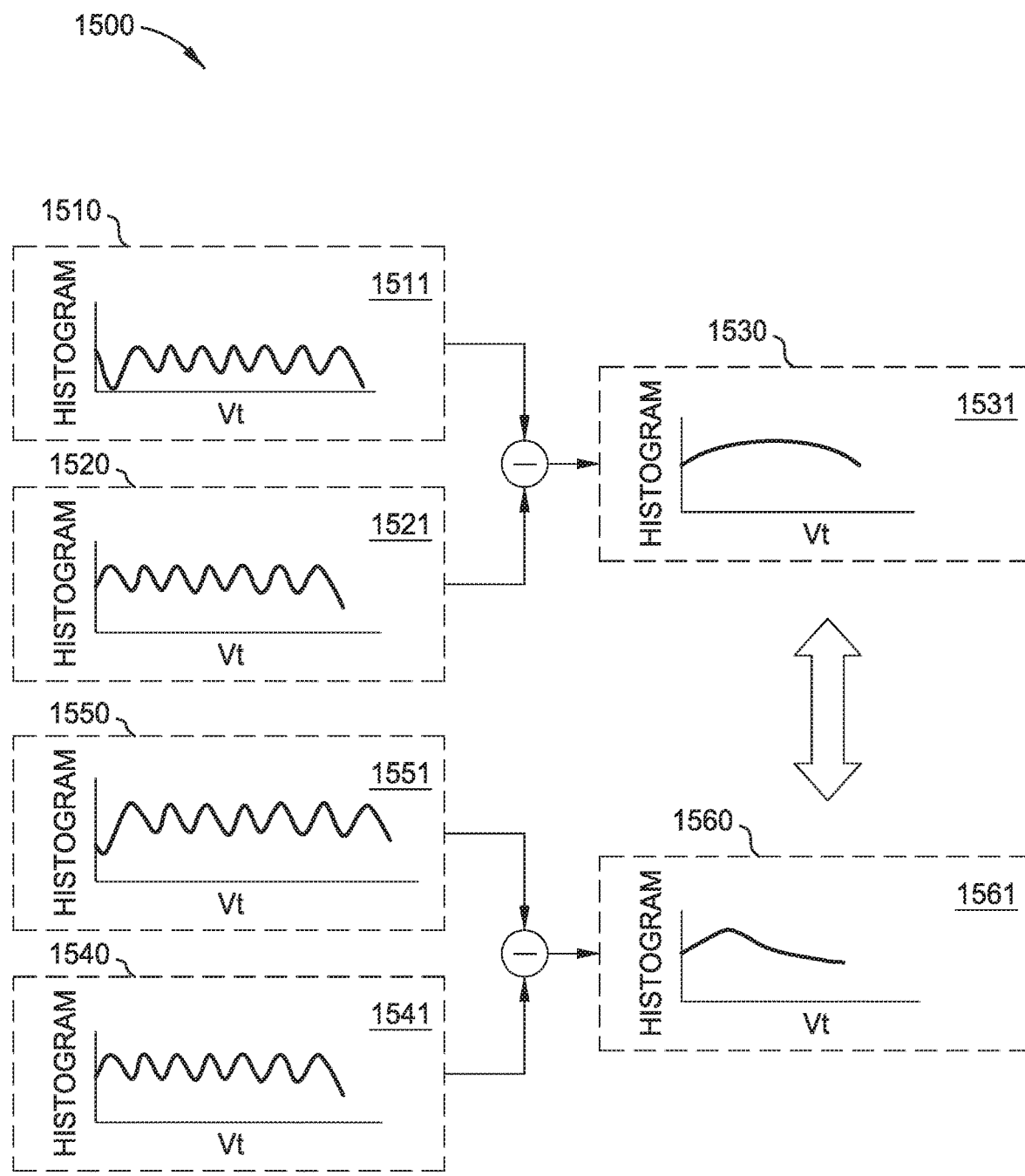
FIG. 15 is a schematic diagram of one embodiment of an offline characterization of a group of memory cells of a memory array, according to one embodiment.

An offline characterization, such as a characterization performed by a data storage device manufacturer/vendor, of a memory array may be made to model a Vt shift or TCO due to cross temperature-induced CVD widening correlated to individual characteristics attributable to the memory cells. FIG. 15 is a schematic diagram of one embodiment of an offline characterization 1500 of a group of memory cells of a memory array. The group of memory cells characterized offline may by from one or more NAND strings, from one or more word lines, from one or more pages, from one or more blocks, from one or more dies, or combinations thereof.

The offline characterization 1500 includes processes for determining actual TCOs of the group of memory cells. At process 1510, the group of memory cells are programmed with a selected soft bit or hard bit at a first temperature (referred to as program temperature in FIG. 15), and the Vts of each memory cell are measured at the first temperature. At process 1520, the group of memory cells are heated or cooled to a second temperature (referred to read temperature in FIG. 15), and the Vts of each memory cell are measured at the second temperature. At process 1530, an actual TCO of each memory cell (i.e., the threshold voltage change ΔVt measured from the first temperature to the second temperature) may be determined. The programming at a first temperature and measurements of the Vt at the first temperature and the second temperature can occur over a number of programming/erase cycles. Each memory cell may be programmed with a certain selected soft bit or hard bit in each cycle. The Vts of the memory cells over the number of cycles at the first temperature are represented in Vt histogram 1511. The Vts of the memory cells over the number of cycles at the second temperature are represented in Vt histogram 1521. The actual TCOs of the memory cells over the number of cycles are represented in TCO histogram 1531. In one embodiment, the first temperature may be a low temperature of 0° C. or below (such as negative −30° C. for example) and the second temperature may be a high temperature of 50° C. or above (such as positive +85° C. for example). In another embodiment, the first temperature may be a high temperature of 50° C. or above (such as positive +85° C. for example), and the second temperature may be a low temperature of 0° C. or below (such as negative −30° C. for example).

The offline characterization 1500 includes processes for determining proxies to be correlated to the actual TCOs to be used in providing an estimated TCO for a memory cell in operation. At process 1540, the Vts of each memory cell is measured at the second temperature under a first read parameter, which may be the same measurement at process 1520. At process 1550, the Vts of each memory cell is measured at the second temperature under a second read parameter different from the first read parameter. At process 1560, a proxy of each memory cell of a threshold voltage change ΔVt measured from first read parameter to the second read parameter (in which both read parameters are conducted at the second temperature) may be determined. Processes 1540, 1550 may be conducted with processes 1510, 1520 over a number of programming/erase cycles. The Vts of the memory cells over the number of cycles at the second temperature at a first read parameter are represented in Vt histogram 1541. The Vts of the memory cells over the number of cycles at the second temperature at a second read parameter are represented in Vt histogram 1551. The proxies for the TCOs of the memory cells over the number of cycles are represented in proxy histogram 1561.

The different read parameters of processes 1540, 1550 at the same second temperature include changing at least one of the following read parameters: bit line voltage (Vblc), sense amplifier integration time (SEN2), and other read parameters. The measurement of the Vt of a memory cell at two different read parameters may serve as a proxy to the actual TCO measured for a memory cell's specific physical characteristics, such as a cell's sub-threshold slope. For example, a proxy may be determined from a difference between the two measurements taken with different Vblc and/or SEN2 values expressed as follows:

$$\text{proxy}_{i,j} = \text{measurement }(Vblc_i, SEN2_i) - \text{measurement }(Vblc_j, SEN2_j) \quad (1)$$

Other equations/definitions of a single component proxy vector based upon measurements of the Vt of a memory cell at two different read parameters are possible.

In one embodiment, the offline characterization 1500 may include a single proxy (i.e., two measurements of the Vt of a memory cell at two different read parameters at the second temperature) associated with each TCO measurement. In another embodiment, the offline characterization 1500 may include multiple proxies (i.e., three or more measurements of the Vt of a memory cell at three different read parameters at the second temperature) associated with each TCO measurement. For example a multiple component proxy vector may be expressed as follows:

$$\text{proxy} = (\text{proxy}_{i,j}, \text{proxy}_{j,k}) \quad (2)$$

Other equations/definitions of a multiple component proxy vector based upon measurements of the Vt of a memory cell at three or more different read parameters are possible.

For embodiments of the offline characterization 1500 of multiple measurements of a group of memory cells in which a single proxy (i.e., a single component proxy vector) is determined for each TCO measurement, a single estimated TCO value or correction term $\Delta V_{i,j}$ may be correlated for each proxy value or range. The estimated TCO value or correction term $\Delta V_{i,j}$ based upon single proxies may be estimated using conditional expectation estimation, also called minimum mean square error (MMSE) estimation, but other estimations are possible. The correction term $\Delta V_{i,j}^{MMSE}$ using MMSE may be expressed as follows:

$$\Delta V_{i,j}^{MMSE} = E[\Delta V | \text{proxy}_{i,j}, T_{read}, T_{write}] \quad (3)$$

Assuming a linear temperature dependency this correction term may be simplified and expressed as follows:

$$\Delta V_{i,j}^{MMSE} = E\left[\frac{\Delta V}{\Delta T} \middle| \text{proxy}_{i,j}\right] \cdot \Delta T \quad (4)$$

Figure 16:
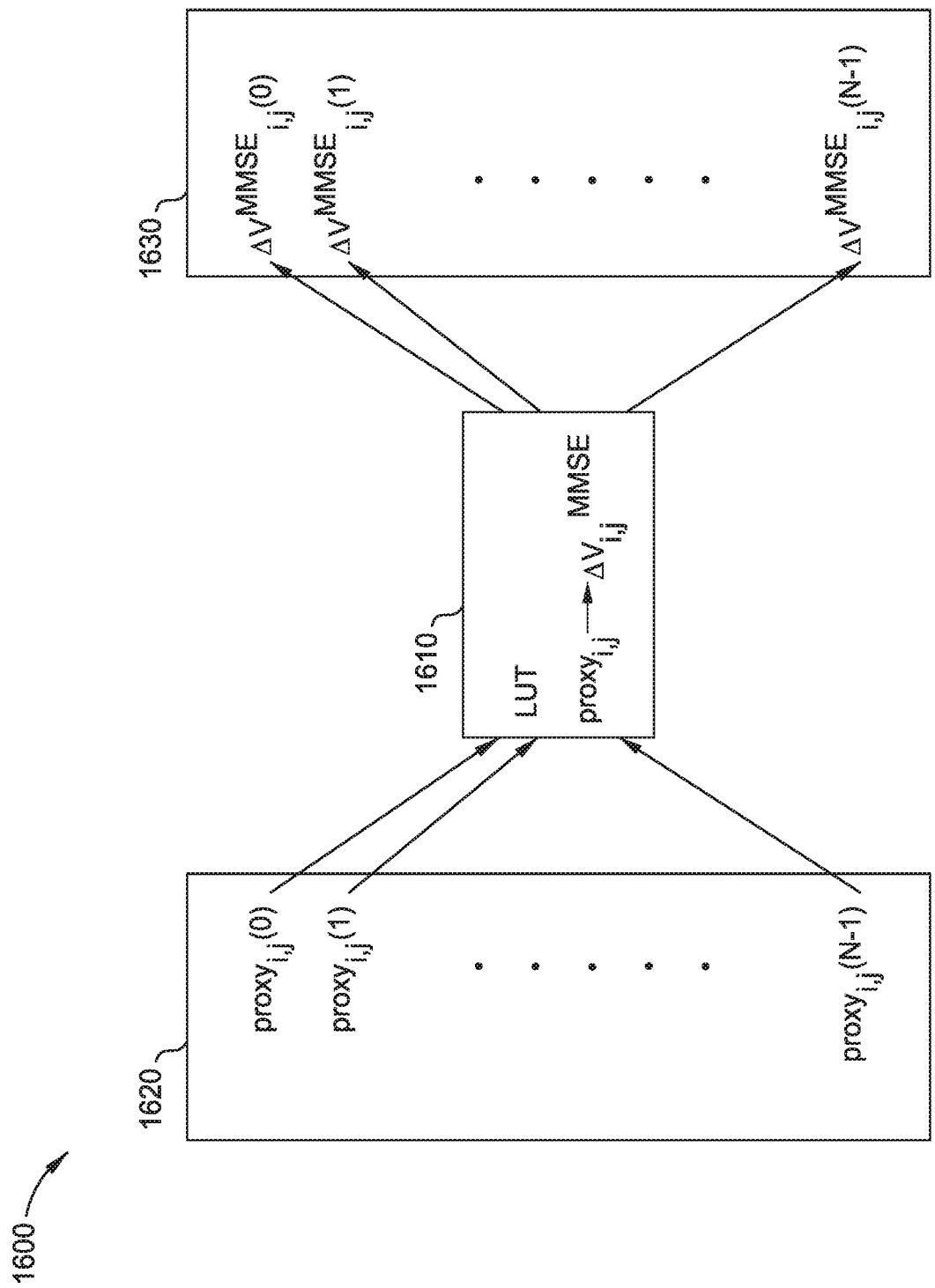
FIG. 16 is a schematic diagram of one embodiment of a look-up table with proxies correlated to estimated TCO values or correction terms, according to one embodiment.

In which E is the average value of all actual TCOs or $\Delta V$s with the same single proxy value measured in offline characterization. As shown in FIG. 16, an example LUT 1600 is shown where each proxy value is correlated with a single estimated TCO value stored in a LUT 1610. LUT 1610 contains N number of proxy values 1620 correlated to N number of estimated TCO value or correction terms $\Delta V$ and N number of resultant MMSE values 1630.

For embodiments of the offline characterization 1500 of FIG. 15 of multiple measurements of a group of memory cells in which multiple proxies (i.e., a multiple component proxy vector) are determined for each TCO measurement, a single estimated TCO value or correction term $\Delta V$ may be correlated for each proxy vector. The estimated TCO value correction term $\Delta V$ based upon multiple proxies may be estimated using linear estimation using 2nd order statistics, but other estimations are possible. The correction term $\Delta V^{lin}$ using linear estimation may be expressed as follows:

$$\Delta V^{lin} = W \cdot \text{proxies} + b \quad (5)$$

in which, $$W = C_{\Delta V, \text{proxies}} C^{-1}_{\text{proxies}, \text{proxies}}$$

$$b = E(\Delta V) - W \cdot E(\text{proxies}) \quad (6)$$

where C is the covariance matrix and E is the average value of all actual TCO or $\Delta V$ with the same proxy vector measured in offline characterization. Each proxy vector may be correlated with a single estimated TCO value stored in a LUT 1610.

Figure 17:
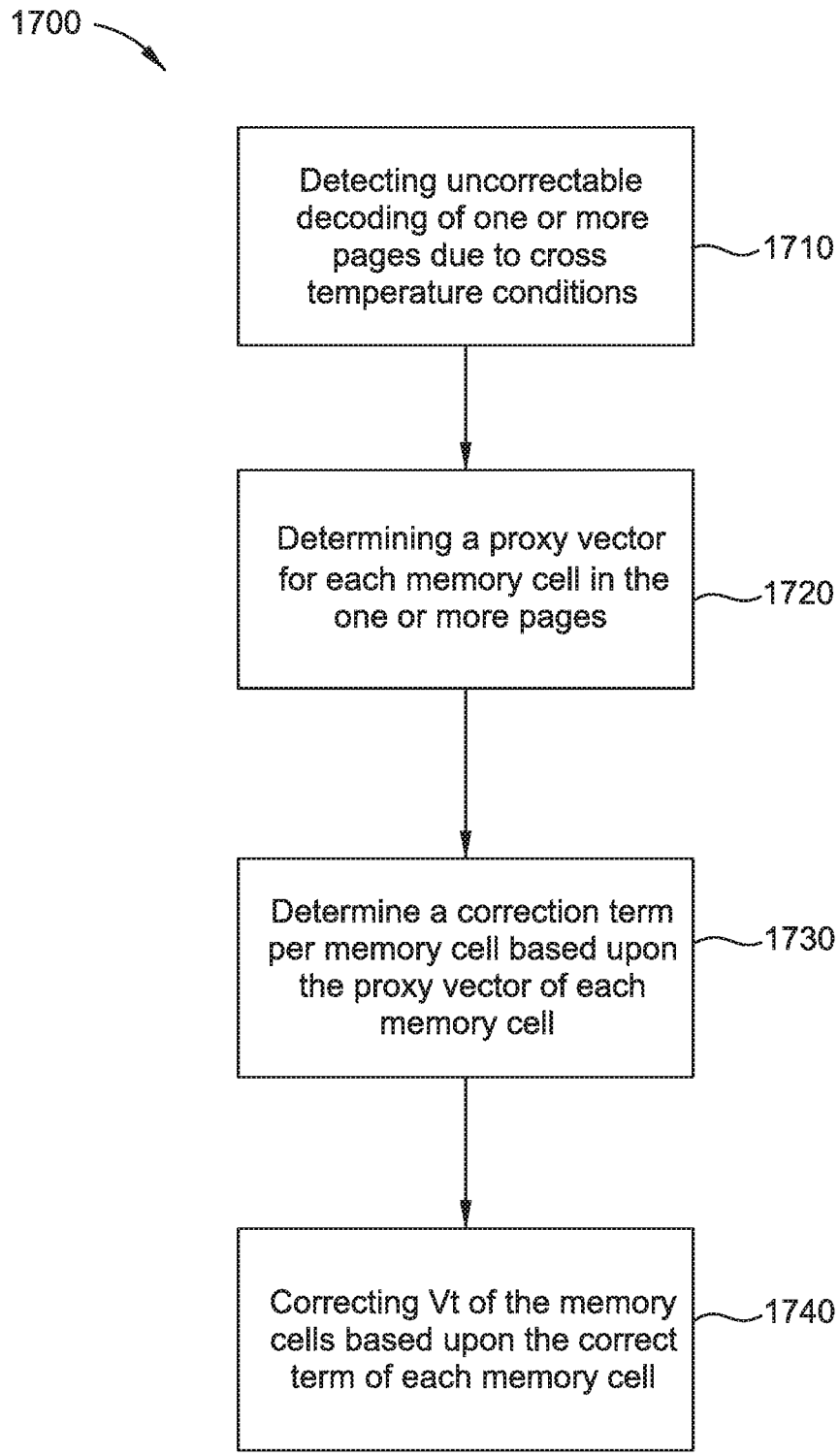
FIG. 17 is a flowchart of one embodiment of a method of accessing data from a memory storage device in operation by compensating for cross-temperature induced CVD widening, according to one embodiment.

FIG. 17 is a flowchart 1700 of one embodiment of a method of accessing data from a memory storage device in operation (i.e., connected to or embedded in an access device) by compensating for cross temperature-induced CVD widening. Flowchart 1700 will be described in reference to data storage device data storage device 102 and memory array 1310 of FIGS. 1A and 1B, respectively, but other storage devices and memory arrays are applicable. At block 1710, controller 120 receives a read operation request from access device 180. The controller 120 retrieves data stored in memory array 1310 and performs an error correcting decoding process known in the art. If controller 120 detects or determines that decoding of one or more pages 1390 of memory array 1310 from the read operation is uncorrectable due to cross temperature conditions, the controller 120 proceeds to block 1720.

At block 1720, the controller 120 determines a proxy vector (i.e., a single component proxy vector or multiple component proxy vector) for each memory cell identified at block 1710. The proxy vectors are determined in operation of data storage device 102. The proxy vectors are determined at the start of operations by making two or more measurements of Vts of each memory cell under two or more different read parameters. For example, two measurements of Vts of each memory cell under two different read parameters are made for a single component proxy vector, and three or more measurements of Vts of each memory cell under three or more different read parameters are made for a multiple component proxy vector. The proxy vectors measured in operation are related to a memory cell's specific physical characteristics, such as a cell's sub-threshold slope. The set of different read parameters in operation may be the same as or approximate to the set of different read parameters made in offline characterization.

If a default read parameter at the read temperature is used at one of the proxies at block 1720, then these Vts measured at the default parameter may serve as baseline Vts corrected at block 1740. If a default read parameter at the read temperature is not used at one of the proxies at block 1720, then Vts of the memory cells at a default read parameter at the read temperature are measured to serve as the baseline Vts corrected at block 1740.

At block 1730, an estimated TCO or correction term $\Delta V$ per memory cell is determined based upon the proxy vectors at block 1720. In one embodiment, a correction term is determined by retrieving the correction term correlated to the proxy in a look-up table (LUT) stored in non-volatile memory (such as ROM) of controller 120 or memory 104. The LUT may be generated offline as disclosed in the offline characterization 1500 in reference to FIG. 15 or generated by other processes. In another embodiment, the controller 120 may calculate a correction term per memory cell from proxy vectors at block 1730. For example, a matrix W and b may be obtained during offline memory characterization, such as offline characterization 1500 in reference to FIG. 15 and in reference to equation (6), and stored in non-volatile memory (such as ROM) of controller 120 or memory 104. The controller 120 may calculate a correction term based upon the stored matrix W and b.

In certain embodiments, in which a multiple component proxy vector is determined at block 1720, a correction term may be determined based upon a sub-set of the components of the multiple component proxy vector. For example, there may be an optimal proxy vector component of two optimal reads from three or more reads. In another example, there may be two optimal proxy vector components based upon three or four more optimal reads. The controller 120 may determine the sub-set or optimal proxy vector component(s) during operation of the data storage device 102. For example, the controller 120, in operation, may search over the multiple proxies components correlated to different correction terms from offline characterization 1500.

At block 1740, the correction terms from block 1730 are used to correct each memory cell's Vt as appropriate. In one embodiment, the Vt of each memory cell may be corrected to provide the following new Vts expressed as follows in which Vt is the read Vt in operation and in which $\Delta V$ is the correction term:

$$Vt_{new} = Vt + \Delta V \quad (7)$$

In another embodiment, the change in temperature during operation from a write operation at temperature $T_{write}$ to read operation at temperature $T_{read}$ may be used to correct the Vt of each memory cell to provide the following new Vts expressed as follows based upon a linear dependency on temperature:

$$Vt_{new} = Vt + \frac{\Delta V}{\Delta T_{characterization}} \times \Delta T_{write,read} \qquad (8)$$

The memory cells with corrected or new Vts may be decoded with lower BER in comparison to Vts without any cross temperature mitigation.

In additional embodiments, the proxy vector, subset of the proxy vector, and/or correction term may be stored as a tag associated to the physical address of the memory cell. This tag may be used to speed up next the next recovery flow in case of another decoding failure of memory associated to the physical address. The tag can be used as a starting point in accessing data to the memory cell in repeating one or more blocks of flowchart 1700.

Figure 18:
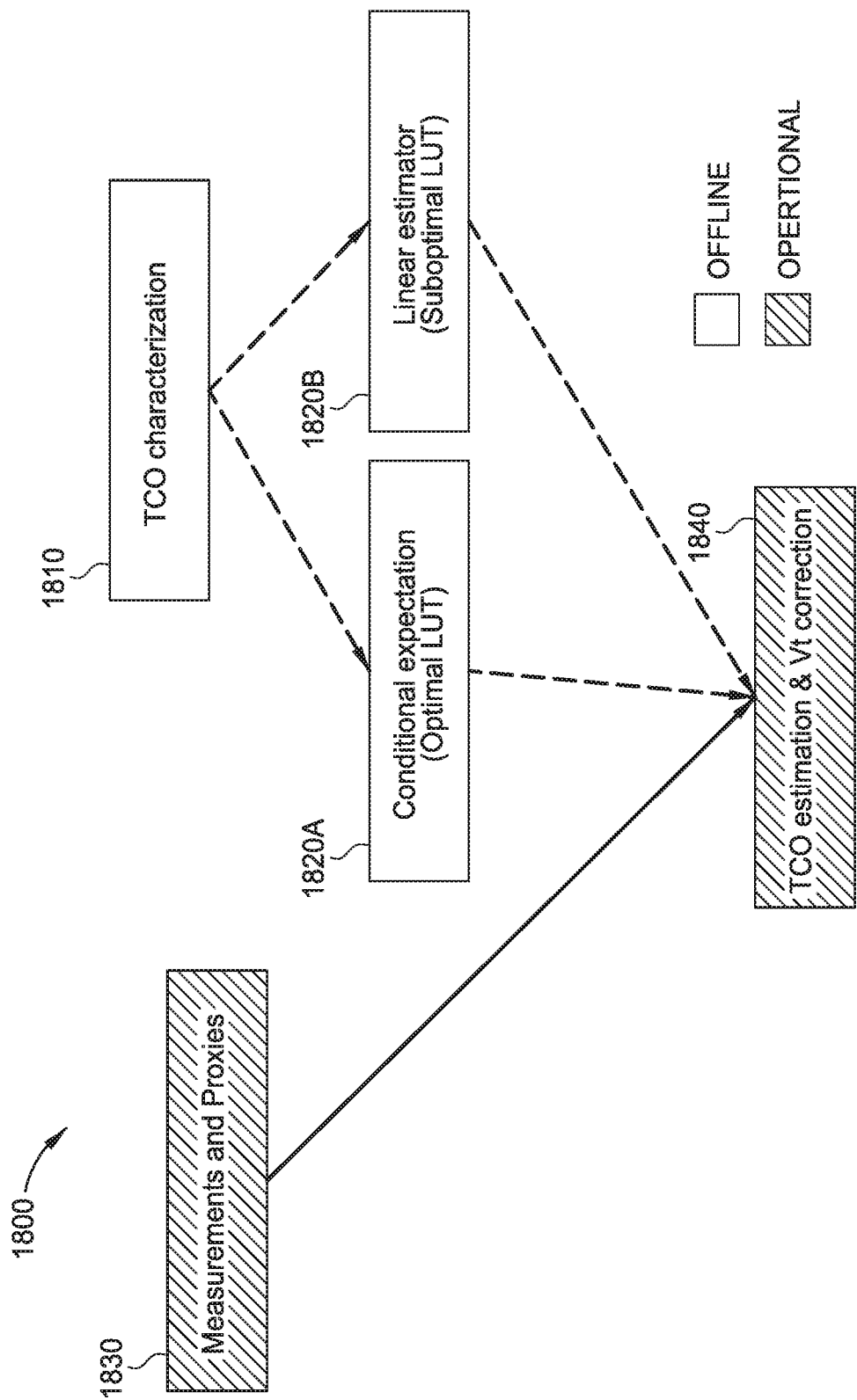
FIG. 18 is schematic diagram illustrating embodiments of a method of mitigating cross-temperature induced CVD widening, according to one embodiment.

FIG. 18 is schematic diagram illustrating embodiments of a method 1800 of mitigating cross temperature-induced CVD widening. At process 1810, the actual TCO characterization of a memory array may occur offline. At process 1820A, a LUT may be generated offline correlating a single proxy to a single estimated TCO value. In process 1820B, a LUT may be generated offline correlating multiplies proxies to a single estimated TCO value. The LUT generated at process 1820A or 1820 may be stored in a memory device to provide Vt correction in operation of the memory device at process 1840 in conjunction measuring Vt at a read temperature with different read parameters for determining proxy vectors at process 1830. In one embodiment, each memory array is characterized offline. In another embodiment, one memory array is characterized offline and this characterization is used for other memory arrays of the same design, of the same specifications, from the same manufacturing lot, or from the same wafer.

In certain embodiments, corrected Vts have narrower CVD state distributions may be achieved providing lower BERs with higher probability to allow decoding. In certain embodiments, SSD may operate in more extreme temperature requirements since cross-temperature induced CVD widening is mitigated. Tolerating more extreme cross-temperatures with increased system reliability may be used in automotive application due to its extreme operating requirements (−40° C. to 105° C.).

Although the controller 120 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform one or more operations described herein, such as one or more operations or blocks of the methods 900-1500, 1700, and 1800. In a particular embodiment, the data storage device 102 includes machine-executing instructions (e.g., firmware) in a non-transitory readable medium by a computer, hardware, a process (e.g., a microprocessor), and/or machine. Alternatively or in addition, instructions that are executed by the processor may be retrieved memory device 103 or other memory, such as at a read-only memory (ROM) that is external to the memory device 103.

It should be appreciated that one or more operations described herein as being performed by the controller 120 may be performed at the memory device 103. As an illustrative example, in-memory ECC operations (e.g., encoding operations and/or decoding operations) may be performed at the memory device 103 alternatively or in addition to performing such operations at the controller 120.

To further illustrate, the data storage device 102 may be configured to be coupled to the access device 180 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an access device (e.g., the access device 180) via a network. For example, the data storage device 102 may be a network-attached storage (NAS) device or a component (e.g., a SSD component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

In certain embodiments, this disclosure may be used to advantage in non-monolithic stacked 3D arrays and monolithic three dimensional (3D) arrays, such as BiCS memory arrays, to address shifting and widening of CVD due the layers of memory cells formed vertically and due to charge trapping based technology. Each memory cells of a 3D array may have different CVD distributions and exhibit different Vt shifts due to temperatures changes at programming versus at reading.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

EXAMPLES

The following are examples to illustrate various embodiments of accessing data or recovering data in a data storage device. For illustration purposes, these examples will be described in reference to FIG. 1A. Such examples are not meant to limit the scope of the disclosure unless specifically set forth in the claims.

Example 1

Table 1 below provides an example of offline TCO characterization and correlation with a single proxy to provide correction term $\Delta V_{i,j}^{MMSE}$ utilizing estimation equation (4). In this example, seven TCO measurement are made along with a single proxy measurement in an offline TCO characterization of memory 102 or memory array 1310 although any number of TCO measurements may be made. In Table 1,

TABLE 1

| TCO | Proxy |
|---|---|
| 50 | 50 |
| 100 | 100 |
| 150 | 50 |
| 50 | 100 |
| 10 | 50 |
| 200 | 100 |
| 130 | 50 | four actual TCO measurements have the same proxy value 50. The actual TCO measurements having the same proxy value 50 are averaged providing an estimated TCO value of 85 for the proxy value 50. In Table 1, three actual TCO measurements have the same proxy value 100. The actual TCO measurements having the same proxy value 100 are averaged providing an estimated TCO value of 116.7 for the proxy value 100.

Example 2

Figure 19:
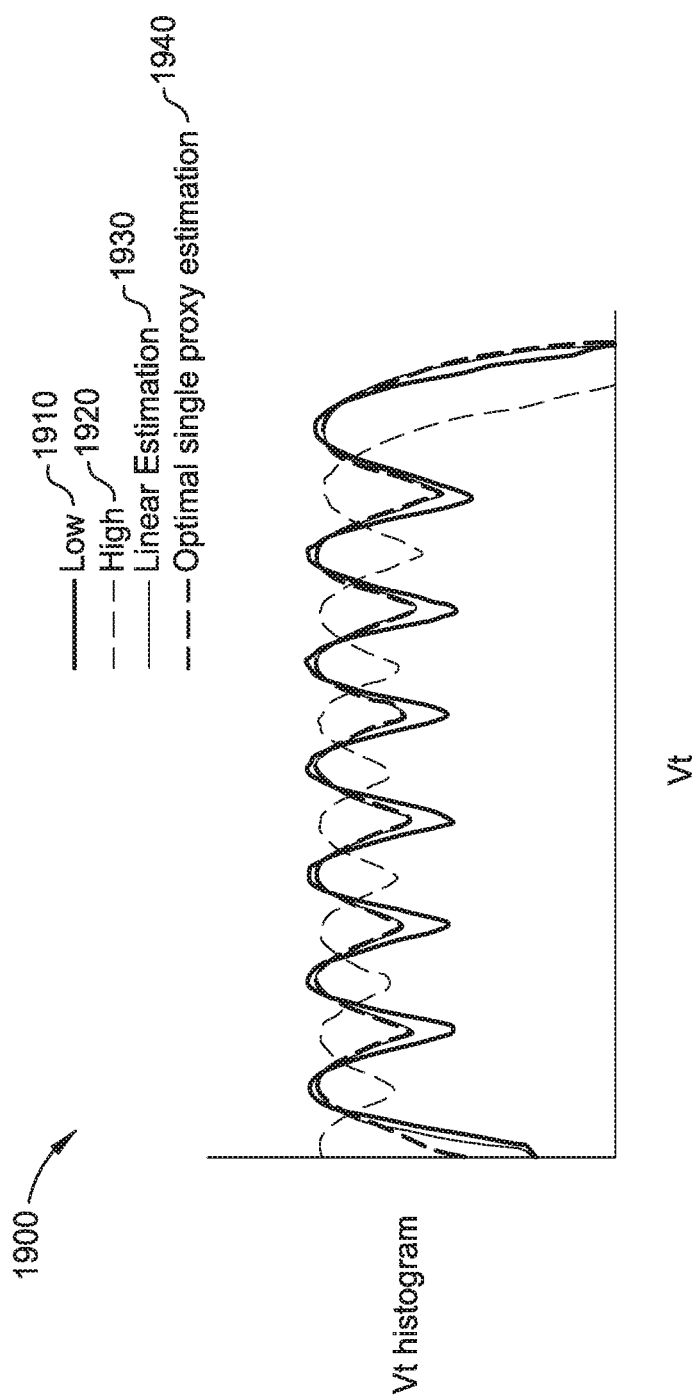
FIG. 19 is a graph illustrating one embodiment of TCO characterization and correction of a memory cell, according to one embodiment.

FIG. 19 is a graph 1900 illustrating one embodiment of TCO characterization and correction of a group of memory cells. A curve 1910 is the Vt distribution in a program temperature at −30° C. (low temperature) programming a plurality of softbits under a number of cycles. A curve 1920 is the Vt distribution in a read temperature at 85° C. (high temperature) and has 1.15% cell error rate (CER). A curve 1930 is the Vt distribution after TCO correction obtained using a linear estimator based on multiple proxies for each actual TCO measurement and has 0.7% CER. A curve 1940 is the Vt distribution after TCO correction obtained using optimal conditional expectation estimator based a single proxy for each actual TCO measurement and has 0.73% CER.

Both curve 1930 and curve 1940 are much narrower than the curve 1920 indicating that the Vt correction of curve 1930 and curve 1940 reduced the BER. The BER reduction of curve 1930 using multiple proxies has slightly better BER reduction than curve 1940 using a single proxy.

The present disclosure describes devices and methods for mitigating increased BER due to temperature changes between programming and reading memory locations. As each memory cell can have a different TCO, each cell may have a different Vt. As a result, reading a memory page may result in the shifting and widening of CVDs and a significantly increased BER. By correcting the Vt for each cell by estimating the TCO per cell and correcting each cell's Vt. This will result in narrowing the CVD and a corresponding reduction in BER.

A data storage device that includes a non-volatile memory, a controller coupled to the non-volatile memory, the controller operable to measure a first Vt of a memory cell under a first parameter at a read temperature, measure a second Vt of the memory cell under a second parameter at the read temperature, where the first parameter is different from the second parameter, determine a Vt correction term for the memory cell based upon the first Vt measurement and the second Vt measurement, and adjust a read Vt of the memory cell by using the Vt correction term.

The device may also include where the first parameter of measuring the first Vt is a default read parameter. The device may also include where the first parameter and the second parameter are different than a default read parameter, the controller further operable to measure a third Vt of the memory cell under the default read parameter at the read temperature. The device may also include where the read Vt of the memory cell is measured under a default read parameter at the read temperature. The device may also include where the Vt correction term is retrieved from a look-up table. The device may also include where the measured first Vt and the measured second Vt serve as a proxy. The device may also include where the Vt correction term is retrieved from a look-up table, the look-up table correlating the proxy to the Vt correction term. The device may also include where the Vt correction term is determined by measurements of one or more proxies at a temperature proximate the read temperature and by measurements of an actual temperature coefficient at the temperature proximate the read temperature. The device may also include where the Vt correction term is determined by measurements of one or more proxies at a temperature different than the read temperature and by measurements of an actual temperature coefficient at the temperature different than the read temperature. The device may also include where the look-up table is stored in a non-volatile memory of the controller.

A method of accessing data from a data storage device that includes measuring a first plurality of Vts of a page of memory cells under a first parameter at a read temperature, the first parameter including a first bit line voltage and a first sense amplifier integration time, measuring a second plurality of Vts of the page of memory cell under a second parameter at the read temperature, the second parameter including a second bit line voltage and a second sense amplifier integration time, retrieving a Vt correction term for each memory cell of the page of memory cells based upon the measured Vts under the first parameter and upon the measured Vts under the second parameter, and adjusting a read Vt for each memory cell of the page of memory cells by using the Vt correction term.

The method may also include where the first parameter of measuring the first Vt is a default read parameter. The method may also include where the first parameter and the second parameter are different than a default read parameter, the method further including measuring a third Vt of the memory cell under the default read parameter. The method may also include where the read Vt of the memory cell is measured under a default read parameter at the read temperature. The method may also include where the first bit line voltage and the second bit line voltage are different. The method may also include where the first sense amplifier integration time and the second sense amplifier integration time are different. The method may also include where the first bit line voltage and the second bit line voltage are different and where the first sense amplifier integration time and the second sense amplifier integration time are different. The method may also include where the Vt correction term is retrieved from a look-up table.

A non-transitory computer readable storage medium containing instructions that, when executed by a controller, perform a method of accessing data from a data storage device that includes measuring a first Vt and a second Vt of a memory cell at different read parameters, determining a temperature coefficient proxy for the memory cell, retrieving an estimated temperature coefficient value correlated to the temperature coefficient proxy of the memory cell, and adjusting a read Vt of the memory cell by using the estimated temperature coefficient value.

The medium may also include where the first parameter of measuring the first Vt is a default read parameter. The medium may also include where the first parameter and the second parameter are different than a default read parameter, the method further including measuring a third Vt of the memory cell under the default read parameter. The medium may also include where the read Vt of the memory cell is measured under a default read parameter at the read temperature. The medium may also include where the estimated temperature coefficient value is based upon an estimation of actual temperature coefficient measurements and single proxy measurements. The medium may also include where the estimation is a conditional expectation estimation. The medium may also include where the estimated temperature coefficient value is based upon an estimation of actual temperature coefficient measurements and multiple proxy measurements. The medium may also include where the estimation is a linear estimation.

A data storage device that includes a non-volatile memory and a cell voltage distribution mitigating means for adjusting a Vt of a memory cell of the non-volatile memory, the cell voltage distribution mitigation means operable to measure the Vt of the memory cell at two different read parameters at a read temperature. The device may also include the means is further operable to retrieve from a look-up table a Vt correction term correlated to the measured Vt at two different read parameters. The device may also include the means is further operable to adjust a read Vt using the Vt correction term. The device may also include where the look-up table is stored in the cell voltage distribution mitigating means. The device may also include the means is further operable to adjust the Vt of the memory cell after detecting uncorrectable decoding of the memory cell.

A method of mitigating cell voltage distribution widening due to cross temperature conditions in a data storage device, including characterizing an estimated temperature coefficient (TCO) value for each memory cell of one or more memory arrays, where the characterization generates an offline look-up table, and where the look-up table correlates a single proxy to a single TCO value, measuring a Vt at a read temperature with one or more read parameters to determine one or more proxy vectors, applying the proxy vector to determine a corrected Vt, and applying the corrected Vt to a read/write operation.

The method may also include where the look-up table correlates multiple proxies to a single TCO value. The method may also include where one memory array is characterized offline and the characterization is applied to other related memory arrays, where other related memory arrays include at least one of a memory array of a same design, of a same specifications, from a same manufacturing lot, and from a same wafer. The method may also include where memory access parameters include at least one of a read temperature of a block of data, read temperature of a word line, read Vts, write temperature of a block of data, and write temperature of a word line.

While the foregoing is directed to embodiments of the present disclosure, other and further embodiments of the disclosure may be devised without departing from the basic scope thereof, and the scope thereof is determined by the claims that follow.

What is claimed is:

1. A data storage device comprising:
   a non-volatile memory;
   a controller coupled to the non-volatile memory, the controller operable to:
   measure a first threshold voltage of a memory cell under a first parameter at a read temperature;
   measure a second threshold voltage of the memory cell under a second parameter at the read temperature, wherein the first parameter is different from the second parameter;
   determine a threshold voltage correction term for the memory cell based upon the first threshold voltage measurement and the second threshold voltage measurement; and
   adjust a read threshold voltage of the memory cell by using the threshold voltage correction term.

2. The data storage device of claim 1, wherein the first parameter of measuring the first threshold voltage is a default read parameter.

3. The data storage device of claim 1, wherein the first parameter and the second parameter are different than a default read parameter, the controller further operable to measure a third threshold voltage of the memory cell under the default read parameter at the read temperature.

4. The data storage device of claim 1, wherein the read threshold voltage of the memory cell is measured under a default read parameter at the read temperature.

5. The data storage device of claim 1, wherein the threshold voltage correction term is retrieved from a look-up table.

6. The data storage device of claim 1, wherein the measured first threshold voltage and the measured second threshold voltage serve as a proxy.

7. The data storage device of claim 6, wherein the threshold voltage correction term is retrieved from a look-up table, the look-up table correlating the proxy to the threshold voltage correction term.

8. The data storage device of claim 7, wherein the threshold voltage correction term is determined by measurements of one or more proxies at a temperature proximate the read temperature and by measurements of an actual temperature coefficient at the temperature proximate the read temperature.

9. The data storage device of claim 7, wherein the threshold voltage correction term are determined by measurements of one or more proxies at a temperature different than the read temperature and by measurements of the actual temperature coefficient at a temperature different than the read temperature.

10. The data storage device of claim 7, wherein the look-up table is stored in a non-volatile memory of the controller.

11. A method of accessing data from a data storage device, comprising:
   measuring a first plurality of threshold voltages of a page of memory cells under a first parameter at a read temperature, the first parameter comprising a first bit line voltage and a first sense amplifier integration time;
   measuring a second plurality of threshold voltages of the page of memory cell under a second parameter at the read temperature, the second parameter comprising a second bit line voltage and a second sense amplifier integration time;
   retrieving a threshold voltage correction term for each memory cell of the page of memory cells based upon the measured threshold voltages under the first parameter and upon the measured threshold voltages under the second parameter; and
   adjusting a read threshold voltage for each memory cell of the page of memory cells by using the threshold voltage correction term.

12. The method of claim 11, wherein the first parameter of measuring the first threshold voltage is a default read parameter.

13. The method of claim 11, wherein the first parameter and the second parameter are different than a default read parameter, the method further comprising measuring a third threshold voltage of the memory cell under the default read parameter.

14. The method of claim 11, wherein the read threshold voltage of the memory cell is measured under a default read parameter at the read temperature.

15. The method of claim 11, wherein the first bit line voltage and the second bit line voltage are different.

16. The method of claim 11, wherein the first sense amplifier integration time and the second sense amplifier integration time are different.

17. The method of claim 11, wherein the first bit line voltage and the second bit line voltage are different and wherein the first sense amplifier integration time and the second sense amplifier integration time are different.

18. The method of claim 11, wherein the threshold voltage correction term is retrieved from a look-up table.

19. A data storage device comprising:
   a non-volatile memory; and
   a cell voltage distribution mitigating means for adjusting a threshold voltage of a memory cell of the non-volatile memory, the cell voltage distribution mitigation means operable to measure the threshold voltage of the memory cell at two different read parameters at a read temperature, the cell voltage distribution mitigation means further operable to retrieve from a look-up table a threshold voltage correction term correlated to the measured threshold voltage at two different read parameters, wherein the look-up table is stored in the cell voltage distribution mitigating means, the cell voltage distribution mitigation means further operable to adjust the threshold voltage of the memory cell after detecting uncorrectable decoding of the memory cell.

20. The data storage device of claim 19, wherein the cell voltage distribution mitigation means are further operable to adjust a read threshold voltage using the threshold voltage correction term.

* * * * *